(12) United States Patent
Olarig et al.

(10) Patent No.: US 11,461,258 B2
(45) Date of Patent: *Oct. 4, 2022

(54) SELF-CONFIGURING BASEBOARD MANAGEMENT CONTROLLER (BMC)

(71) Applicant: Samsung Electronics Co., Ltd., Suwon-si (KR)

(72) Inventors: Sompong Paul Olarig, Pleasanton, CA (US); Son T. Pham, San Ramon, CA (US)

(73) Assignee: SAMSUNG ELECTRONICS CO., LTD.

(*) Notice: Subject to any disclaimer, the term of this patent is extended or adjusted under 35 U.S.C. 154(b) by 0 days.

This patent is subject to a terminal disclaimer.

(21) Appl. No.: 15/345,509

(22) Filed: Nov. 7, 2016

(65) Prior Publication Data

US 2018/0074984 A1 Mar. 15, 2018

Related U.S. Application Data

(60) Provisional application No. 62/394,727, filed on Sep. 14, 2016.

(51) Int. Cl.
G06F 3/06 (2006.01)
G06F 9/4401 (2018.01)
G06F 13/36 (2006.01)
G11C 16/04 (2006.01)

(52) U.S. Cl.
CPC .............. *G06F 13/36* (2013.01); *G11C 16/04* (2013.01)

(58) Field of Classification Search
CPC .......................... G06F 3/0679; H04L 41/0886
See application file for complete search history.

(56) References Cited

U.S. PATENT DOCUMENTS

| 6,295,567 | B1 * | 9/2001 | Bassman ............... G06F 13/409 361/752 |
| 6,345,303 | B1 | 2/2002 | Knauerhase et al. |
| 6,427,198 | B1 | 7/2002 | Berglund et al. |
| 6,611,863 | B1 | 8/2003 | Banginwar |
| 7,120,759 | B2 | 10/2006 | Chiu et al. |

(Continued)

FOREIGN PATENT DOCUMENTS

| CN | 1641568 A | 7/2005 |
| CN | 101847429 B | 5/2012 |

(Continued)

OTHER PUBLICATIONS

Non-Final Office Action for U.S. Appl. No. 15/256,495, dated Mar. 29, 2018.

(Continued)

*Primary Examiner* — Hyun Nam
(74) *Attorney, Agent, or Firm* — Renaissance IP Law Group LLP

(57) ABSTRACT

A Baseboard Management Controller (BMC) (125) that may configure itself is disclosed. The BMC (125) may include an access logic (415) to determine a configuration of a chassis (105) that includes the BMC (125). The BMC (125) may also include a built-in self-configuration logic (420) to configure the BMC (125) responsive to the configuration of the chassis (105). The BMC (125) may self-configure without using any BIOS, device drivers, or operating systems.

14 Claims, 16 Drawing Sheets

(56) References Cited

U.S. PATENT DOCUMENTS

| | | |
|---|---|---|
| 7,143,153 B1 | 11/2006 | Black et al. |
| 7,512,585 B2 | 3/2009 | Agarwal et al. |
| 7,536,486 B2 | 5/2009 | Sadovsky et al. |
| 7,620,854 B2 | 11/2009 | Kuttan et al. |
| 7,873,700 B2 | 1/2011 | Pawlowski et al. |
| 7,882,393 B2 | 2/2011 | Grimes et al. |
| 7,944,812 B2 | 5/2011 | Carlson et al. |
| 8,065,347 B1 | 11/2011 | DeMeyer et al. |
| 8,180,862 B2 | 5/2012 | Baker et al. |
| 8,396,981 B1 | 3/2013 | Lee et al. |
| 8,667,224 B1 | 3/2014 | Yu et al. |
| 8,832,327 B1 | 9/2014 | Lin |
| 8,943,234 B1 | 1/2015 | Voorhees et al. |
| 8,949,517 B2 | 2/2015 | Cohen et al. |
| 8,953,644 B2 | 2/2015 | Chandra et al. |
| 8,998,636 B2 | 4/2015 | Gomez et al. |
| 9,047,222 B2 | 6/2015 | Chandra et al. |
| 9,092,321 B2 | 7/2015 | Salessi |
| 9,244,877 B2 | 1/2016 | Yang et al. |
| 9,253,275 B2 | 2/2016 | Bhogal et al. |
| 9,280,357 B2 | 3/2016 | Shaver et al. |
| 9,280,504 B2 | 3/2016 | Ben-Michael et al. |
| 9,389,805 B2 | 7/2016 | Cohen et al. |
| 9,400,749 B1 | 7/2016 | Kuzmin et al. |
| 9,460,042 B2 | 10/2016 | Iskandar et al. |
| 9,465,756 B2 | 10/2016 | Bennett |
| 9,648,148 B2 | 5/2017 | Rimmer et al. |
| 9,653,124 B2 | 5/2017 | Heyd et al. |
| 9,734,093 B2 | 8/2017 | Khemani et al. |
| 9,734,106 B2 | 8/2017 | Kotzur et al. |
| 9,785,346 B2 | 10/2017 | Yost |
| 9,785,355 B2 | 10/2017 | Huang |
| 9,785,356 B2 | 10/2017 | Huang |
| 9,811,481 B2 | 11/2017 | Bhatia et al. |
| 9,830,082 B1 | 11/2017 | Srinivasan et al. |
| 9,904,330 B2 | 2/2018 | Schuette et al. |
| 9,906,596 B2 | 2/2018 | Sikdar |
| 9,934,173 B1* | 4/2018 | Sakalley ............ G06F 13/4068 |
| 9,934,183 B2 | 4/2018 | Brassac et al. |
| 9,959,240 B2 | 5/2018 | Mundt |
| 9,965,367 B2 | 5/2018 | Shih |
| 9,990,313 B2 | 6/2018 | Monji et al. |
| 10,019,388 B2 | 7/2018 | Long et al. |
| 10,063,638 B2 | 8/2018 | Huang |
| 10,108,450 B1 | 10/2018 | Pinto et al. |
| 10,114,778 B2 | 10/2018 | Worley et al. |
| 10,162,784 B2 | 12/2018 | Bassett et al. |
| 10,206,297 B2 | 2/2019 | Breakstone et al. |
| 10,223,313 B2 | 3/2019 | Shih |
| 10,223,316 B2 | 3/2019 | Mataya |
| 10,235,313 B2 | 3/2019 | Lee et al. |
| 10,255,215 B2 | 4/2019 | Breakstone et al. |
| 10,275,356 B2 | 4/2019 | Chou et al. |
| 10,289,517 B2 | 5/2019 | Beerens |
| 10,289,588 B2 | 5/2019 | Chu et al. |
| 10,318,443 B2 | 6/2019 | Su |
| 10,346,041 B2 | 7/2019 | Olarig et al. |
| 10,372,648 B2 | 8/2019 | Qiu |
| 10,372,659 B2* | 8/2019 | Olarig ................ G06F 3/0601 |
| 10,394,723 B2 | 8/2019 | Yang et al. |
| 10,452,576 B2 | 10/2019 | Stuhlsatz |
| 10,467,163 B1 | 11/2019 | Malwankar et al. |
| 10,467,170 B2 | 11/2019 | McKnight |
| 10,560,550 B1* | 2/2020 | Xue .................. H04L 41/0668 |
| 10,866,911 B2 | 12/2020 | Qiu et al. |
| 10,901,927 B2 | 1/2021 | Fischer et al. |
| 10,929,327 B1 | 2/2021 | Schrempp et al. |
| 10,942,666 B2 | 3/2021 | Pydipaty et al. |
| 11,113,046 B1 | 9/2021 | Bowen et al. |
| 11,126,352 B2 | 9/2021 | Olarig et al. |
| 2002/0087887 A1* | 7/2002 | Busam ................ H04L 67/1002 726/3 |
| 2002/0095491 A1 | 7/2002 | Edmonds et al. |
| 2002/0123365 A1* | 9/2002 | Thorson ................ H04W 88/08 455/524 |
| 2004/0073912 A1 | 4/2004 | Meza |
| 2004/0111590 A1* | 6/2004 | Klein, Jr. ............ G06F 9/30181 712/226 |
| 2004/0147281 A1* | 7/2004 | Holcombe ............. H04B 1/401 455/550.1 |
| 2004/0153844 A1 | 8/2004 | Ghose et al. |
| 2005/0025125 A1 | 2/2005 | Kwan |
| 2005/0060442 A1 | 3/2005 | Beverly et al. |
| 2005/0120157 A1 | 6/2005 | Chen et al. |
| 2006/0059287 A1 | 3/2006 | Rivard et al. |
| 2006/0095625 A1 | 5/2006 | Wootten et al. |
| 2006/0136621 A1 | 6/2006 | Tung et al. |
| 2008/0003845 A1* | 1/2008 | Hong ....................... H05K 1/14 439/67 |
| 2008/0288708 A1 | 11/2008 | Hsueh |
| 2009/0073896 A1* | 3/2009 | Gillingham ........... G06F 9/5061 370/255 |
| 2009/0077478 A1* | 3/2009 | Gillingham ......... H04L 41/0883 715/763 |
| 2009/0217188 A1 | 8/2009 | Alexander et al. |
| 2010/0077067 A1 | 3/2010 | Strole |
| 2010/0100858 A1* | 4/2010 | Schipper .................. G06F 17/50 716/136 |
| 2010/0106836 A1 | 4/2010 | Schreyer et al. |
| 2010/0169512 A1 | 7/2010 | Matton et al. |
| 2011/0131380 A1 | 6/2011 | Rallens et al. |
| 2011/0151858 A1 | 6/2011 | Lai |
| 2012/0056728 A1 | 3/2012 | Erdmann et al. |
| 2012/0102580 A1* | 4/2012 | Bealkowski ............ G06F 21/88 726/34 |
| 2012/0207156 A1* | 8/2012 | Srinivasan ............. H04L 12/56 370/389 |
| 2012/0311654 A1 | 12/2012 | Dougherty, III et al. |
| 2013/0117503 A1 | 5/2013 | Nellans et al. |
| 2013/0117766 A1* | 5/2013 | Bax ...................... G06F 9/4405 719/323 |
| 2013/0198311 A1 | 8/2013 | Tamir et al. |
| 2013/0242991 A1 | 9/2013 | Basso et al. |
| 2013/0282953 A1 | 10/2013 | Orme et al. |
| 2013/0304979 A1 | 11/2013 | Zimmer et al. |
| 2013/0311795 A1* | 11/2013 | Cong ........................ G06F 1/26 713/300 |
| 2013/0325998 A1 | 12/2013 | Hormuth et al. |
| 2014/0032641 A1 | 1/2014 | Du |
| 2014/0052928 A1 | 2/2014 | Shimoi |
| 2014/0122746 A1* | 5/2014 | Shaver .................. G06F 13/102 710/10 |
| 2014/0195711 A1* | 7/2014 | Bhatia ................. G06F 13/4221 710/313 |
| 2014/0281458 A1 | 9/2014 | Ravimohan et al. |
| 2014/0330995 A1 | 11/2014 | Levy et al. |
| 2014/0344431 A1 | 11/2014 | Hsu et al. |
| 2015/0006758 A1 | 1/2015 | Holtman et al. |
| 2015/0039815 A1 | 2/2015 | Klein |
| 2015/0067188 A1 | 3/2015 | Chakhaiyar |
| 2015/0106660 A1 | 4/2015 | Chumbalkar et al. |
| 2015/0120874 A1 | 4/2015 | Kim et al. |
| 2015/0120971 A1 | 4/2015 | Bae et al. |
| 2015/0138900 A1 | 5/2015 | Choi |
| 2015/0178095 A1 | 6/2015 | Balakrishnan et al. |
| 2015/0181760 A1 | 6/2015 | Stephens |
| 2015/0205541 A1 | 7/2015 | Nishtala et al. |
| 2015/0234815 A1 | 8/2015 | Slik |
| 2015/0254088 A1 | 9/2015 | Chou et al. |
| 2015/0261434 A1 | 9/2015 | Kagan et al. |
| 2015/0301757 A1 | 10/2015 | Iwata et al. |
| 2015/0324312 A1 | 11/2015 | Jacobson et al. |
| 2015/0331473 A1* | 11/2015 | Jreji ........................ G06F 1/3206 713/320 |
| 2015/0350096 A1 | 12/2015 | Dinc et al. |
| 2015/0370665 A1 | 12/2015 | Cannata et al. |
| 2015/0376840 A1 | 12/2015 | Shih |
| 2015/0381734 A1 | 12/2015 | Ebihara et al. |
| 2016/0004879 A1 | 1/2016 | Fisher et al. |
| 2016/0062936 A1* | 3/2016 | Brassac ................ G06F 13/4027 710/314 |
| 2016/0085718 A1 | 3/2016 | Huang |
| 2016/0092390 A1 | 3/2016 | Grothen et al. |

(56) References Cited

U.S. PATENT DOCUMENTS

| | | |
|---|---|---|
| 2016/0094619 A1 | 3/2016 | Khan et al. |
| 2016/0127468 A1 | 5/2016 | Malwankar et al. |
| 2016/0127492 A1 | 5/2016 | Malwankar et al. |
| 2016/0146754 A1 | 5/2016 | Prasad et al. |
| 2016/0188313 A1 | 6/2016 | Dubal et al. |
| 2016/0246754 A1 | 8/2016 | Rao et al. |
| 2016/0259597 A1 | 9/2016 | Worley et al. |
| 2016/0283428 A1 | 9/2016 | Guddeti |
| 2016/0306723 A1 | 10/2016 | Lu |
| 2016/0306768 A1 | 10/2016 | Mataya |
| 2016/0328344 A1 | 11/2016 | Jose et al. |
| 2016/0328347 A1 | 11/2016 | Worley et al. |
| 2016/0337272 A1 | 11/2016 | Berman |
| 2016/0366071 A1 | 12/2016 | Chandran et al. |
| 2017/0068268 A1 | 3/2017 | Giriyappa et al. |
| 2017/0068628 A1 | 3/2017 | Calciu et al. |
| 2017/0068630 A1 | 3/2017 | Iskandar et al. |
| 2017/0168943 A1 | 6/2017 | Chou et al. |
| 2017/0185554 A1 | 6/2017 | Fricker |
| 2017/0206034 A1 | 7/2017 | Fetik |
| 2017/0262029 A1 | 9/2017 | Nelson et al. |
| 2017/0269871 A1 | 9/2017 | Khan et al. |
| 2017/0270001 A1* | 9/2017 | Suryanarayana ... G06F 11/2089 |
| 2017/0286305 A1 | 10/2017 | Kalwitz |
| 2017/0317901 A1 | 11/2017 | Agrawal et al. |
| 2017/0344259 A1 | 11/2017 | Freyensee et al. |
| 2017/0344294 A1 | 11/2017 | Mishra et al. |
| 2017/0357515 A1* | 12/2017 | Bower, III ............ G06F 9/4406 |
| 2018/0004695 A1 | 1/2018 | Chu et al. |
| 2018/0019896 A1 | 1/2018 | Paquet et al. |
| 2018/0032463 A1* | 2/2018 | Olarig ................ G06F 13/4022 |
| 2018/0032471 A1 | 2/2018 | Olarig |
| 2018/0074717 A1 | 3/2018 | Olarig et al. |
| 2018/0101492 A1 | 4/2018 | Cho et al. |
| 2018/0131633 A1 | 5/2018 | Li |
| 2018/0173652 A1 | 6/2018 | Olarig et al. |
| 2018/0210517 A1 | 7/2018 | Yun |
| 2018/0267925 A1* | 9/2018 | Rees ....................... G06F 13/36 |
| 2018/0275919 A1 | 9/2018 | Chirumamilla et al. |
| 2018/0373609 A1 | 12/2018 | Beerens |
| 2019/0104632 A1 | 4/2019 | Nelson et al. |
| 2019/0339888 A1 | 11/2019 | Sasidharan et al. |
| 2020/0293916 A1 | 9/2020 | Li |
| 2022/0188002 A1 | 6/2022 | Olarig |

FOREIGN PATENT DOCUMENTS

| | | |
|---|---|---|
| CN | 104025063 A | 9/2014 |
| CN | 104202197 A | 12/2014 |
| CN | 104572516 A | 4/2015 |
| CN | 104615577 A | 5/2015 |
| CN | 105260275 A | 1/2016 |
| CN | 105912275 A | 8/2016 |
| CN | 103412769 B | 11/2017 |
| EP | 2290497 A1 | 3/2011 |
| EP | 2843557 A1 | 3/2015 |
| JP | 2001290752 A | 10/2001 |
| JP | 4257050 B2 | 4/2009 |
| JP | 2010146525 A | 7/2010 |
| JP | 2011048534 A | 3/2011 |
| JP | 2012506184 A | 3/2012 |
| JP | 2013041390 A | 2/2013 |
| JP | 2014241545 A | 12/2014 |
| JP | 2015049742 A | 3/2015 |
| JP | 2015191649 A | 11/2015 |
| JP | 2015194005 A | 11/2015 |
| JP | 2015532985 A | 11/2015 |
| JP | 2016037501 A | 3/2016 |
| JP | 2016045968 A | 4/2016 |
| JP | WO2015194005 A1 | 4/2017 |
| KR | 20090106469 A | 10/2009 |
| KR | 20120135205 A | 12/2012 |
| KR | 20150047785 A | 5/2015 |
| KR | 20150071898 A | 6/2015 |
| KR | 20160074659 A | 6/2016 |
| TW | 201445325 A | 12/2014 |
| WO | 2014209764 A1 | 12/2014 |
| WO | 2015049742 A1 | 4/2015 |
| WO | 2015191649 A1 | 12/2015 |
| WO | 2016037501 A1 | 3/2016 |
| WO | 2016085016 A1 | 6/2016 |

OTHER PUBLICATIONS

Fang, Chin, "Using NVMe Gen3 PCIe SSD Cards in High-density Servers for High-performance Big Data Transfer Over Multiple Network Channels", SLAC National Accelerator Laboratory, Stanford University, Stanford, California, Feb. 7, 2015, 17 pages.

Final Office Action for U.S. Appl. No. 15/256,495, dated Oct. 19, 2018.

Office Action for U.S. Appl. No. 15/411,962, dated Aug. 10, 2018.

Office Action for U.S. Appl. No. 15/256,495, dated Jun. 14, 2019.

Advisory Action for U.S. Appl. No. 15/256,495, dated Feb. 1, 2019.

Notice of Allowance for U.S. Appl. No. 15/345,507, dated Feb. 19, 2019.

Notice of Allowance for U.S. Appl. No. 15/411,962, dated Mar. 18, 2019.

Final Office Action for U.S. Appl. No. 15/411,962, dated Dec. 20, 2018.

NVM Express over Fabrics specification Revision 1.0; NVM Express Inc.; Jun. 5, 2016. (Year: 2016).

Office Action for U.S. Appl. No. 15/345,507, dated Dec. 3, 2018.

Office Action for U.S. Appl. No. 16/202,079, dated Aug. 22, 2019.

Office Action for U.S. Appl. No. 16/424,474, dated Oct. 15, 2019.

Final Office Action for U.S. Appl. No. 15/256,495, dated Dec. 4, 2019.

Office Action for U.S. Appl. No. 16/421,458, dated Dec. 30, 2019.

Office Action for U.S. Appl. No. 16/424,474, dated Feb. 3, 2020.

Notice of Allowance for U.S. Appl. No. 15/256,495, dated Mar. 5, 2020.

Office Action for U.S. Appl. No. 16/202,079, dated Mar. 4, 2020.

Corrected Notice of Allowability for U.S. Appl. No. 16/202,079, dated Jul. 22, 2020.

Notice of Allowance for U.S. Appl. No. 16/424,474, dated Jul. 15, 2020.

Office Action for U.S. Appl. No. 16/844,995, dated Sep. 4, 2020.

Final Office Action for U.S. Appl. No. 16/424,474, dated May 1, 2020.

Notice of Allowance for U.S. Appl. No. 16/202,079, dated Jun. 1, 2020.

Notice of Allowance for U.S. Appl. No. 16/421,458, dated Apr. 15, 2020.

Corrected Notice of Allowability for U.S. Appl. No. 15/256,495, dated Mar. 18, 2021.

Corrected Notice of Allowability for U.S. Appl. No. 16/424,474, dated Feb. 22, 2021.

Notice of Allowance for U.S. Appl. No. 16/202,079, dated Jan. 27, 2021.

Notice of Allowance for U.S. Appl. No. 16/921,923, dated Feb. 18, 2021.

Corrected Notice of Allowability for U.S. Appl. No. 16/424,474, dated Mar. 29, 2021.

Corrected Notice of Allowability for U.S. Appl. No. 16/921,923, dated Apr. 1, 2021.

Final Office Action for U.S. Appl. No. 16/844,995, dated Mar. 29, 2021.

Notice of Allowance for U.S. Appl. No. 15/403,088, dated Oct. 22, 2018.

OC3D, "What is the New U.2 SSD Connection?," (https://www.overclock3d.net/news/storage/what_is_the_new_u_2_ssd_connection/1), Jul. 2016, retrieved Apr. 12, 2021, 5 pages.

Office Action for U.S. Appl. No. 15/403,088, dated Jun. 7, 2018.

Wikipedia, "SATA Express," (https://en.wikipedia.org/wiki/SATA_Express), retrieved Apr. 12, 2021, 6 pages.

Wikipedia, "U.2," (https://en.wikipedia.org/wiki/U.2), retrieved Apr. 12, 2021, 2 pages.

Office Action for U.S. Appl. No. 16/857,172, dated Oct. 8, 2020.

(56) References Cited

OTHER PUBLICATIONS

Office Action for U.S. Appl. No. 16/921,923, dated Oct. 28, 2020.
Corrected Notice of Allowability for U.S. Appl. No. 15/256,495, dated May 13, 2021.
Corrected Notice of Allowability for U.S. Appl. No. 16/921,923, dated May 26, 2021.
Notice of Allowance for U.S. Appl. No. 16/202,079, dated May 14, 2021.
Notice of Allowance for U.S. Appl. No. 16/424,474, dated Apr. 30, 2021.
Notice of Allowance for U.S. Appl. No. 16/857,172, dated May 3, 2021.
Corrected Notice of Allowability for U.S. Appl. No. 16/202,079, dated Jul. 12, 2021.
Corrected Notice of Allowability for U.S. Appl. No. 16/921,923, dated Jul. 14, 2021.
Corrected Notice of Allowability for U.S. Appl. No. 16/202,079, dated Sep. 15, 2021.
Corrected Notice of Allowability for U.S. Appl. No. 16/424,474, dated Aug. 18, 2021.
Corrected Notice of Allowability for U.S. Appl. No. 16/857,172, dated Aug. 20, 2021.
Corrected Notice of Allowability for U.S. Appl. No. 16/921,923, dated Aug. 24, 2021.
Office Action for U.S. Appl. No. 17/099,776, dated Sep. 24, 2021.
Notice of Allowance for U.S. Appl. No. 16/844,995, dated Sep. 29, 2021.
Office Action for U.S. Appl. No. 17/022,075, dated Oct. 15, 2021.
Corrected Notice of Allowability for U.S. Appl. No. 16/692,997, dated Jun. 18, 2020.
Corrected Notice of Allowability for U.S. Appl. No. 16/844,995, dated Dec. 9, 2021.
Corrected Notice of Allowability for U.S. Appl. No. 16/950,624, dated Jul. 16, 2021.
Corrected Notice of Allowability for U.S. Appl. No. 16/950,624, dated Jun. 10, 2021.
Final Office Action for U.S. Appl. No. 16/211,923, dated Aug. 19, 2019.
Final Office Action for U.S. Appl. No. 16/692,997, dated Mar. 26, 2020.
Final Office Action for U.S. Appl. No. 17/063,501, dated Nov. 2, 2021.
Final Office Action for U.S. Appl. No. 17/063,507, dated Nov. 22, 2021.
Notice of Allowance for U.S. Appl. No. 16/211,923, dated Sep. 13, 2019.
Notice of Allowance for U.S. Appl. No. 16/692,997, dated Jun. 1, 2020.
Notice of Allowance for U.S. Appl. No. 16/950,624, dated May 10, 2021.
OC3D, "What is the New U.2 SSD Connection?" OC3D News, Jul. 2016 (https://www.overclock3d.net/news/storage/what_is_the_new_u_2_ssd_connection/1), retrieved May 2018, 4 pages.
Office Action for U.S. Appl. No. 16/202,079, dated Dec. 9, 2021.
Office Action for U.S. Appl. No. 16/211,923, dated May 6, 2019.
Office Action for U.S. Appl. No. 16/692,997, dated Dec. 19, 2019.
Office Action for U.S. Appl. No. 16/950,624, dated Jan. 25, 2021.
Office Action for U.S. Appl. No. 17/063,501, dated Jul. 15, 2021.
Office Action for U.S. Appl. No. 17/063,507, dated Aug. 6, 2021.
SSD Form Factor Work Group, "Enterprise SSD Form Factor 1.0a", 2021 SSD Form Factor Work Group, pp. 1-55. (Year: 2012).
Wikipedia, "SATA Express", (https://en.wikipedia.org/wiki/SATA_Express), retrieved May 2018, 6 pages.
Wikipedia, "U.2", (https://en.wikipedia.org/wiki.U.2), retrieved May 2018, 3 pages.
Notice of Allowance for U.S. Appl. No. 16/202,079, dated Mar. 17, 2022.
Nortice of Allowance for U.S. Appl. No. 17/099,776, dated Feb. 15, 2022.
Office Action for U.S. Appl. No. 16/844,995, dated Feb. 22, 2022.
Office Action for U.S. Appl. No. 17/063,501, dated Feb. 24, 2022.
Office Action for U.S. Appl. No. 17/063,507, dated Mar. 17, 2022.
Final Office Action for U.S. Appl. No. 17/022,075, dated May 25, 2022.
Notice of Allowance for U.S. Appl. No. 17/063,501, dated Jun. 2, 2022.
Supplemental Notice of Allowability for U.S. Appl. No. 17/099,776, dated May 16, 2022.
Corrected Notice of Allowability for U.S. Appl. No. 16/202,079, dated Jul. 7, 2022.
Corrected Notice of Allowability for U.S. Appl. No. 17/063,501, dated Jul. 7, 2022.
Corrected Notice of Allowability for U.S. Appl. No. 17/063,501, dated Jun. 23, 2022.
Corrected Notice of Allowability for U.S. Appl. No. 17/099,776, dated Jun. 20, 2022.
Final Office Action for U.S. Appl. No. 17/063,507, dated Jun. 27, 2022.
Corrected Notice of Allowability for U.S. Appl. No. 16/202,079, dated Aug. 17, 2022.
Corrected Notice of Allowability for U.S. Appl. No. 17/063,501, dated Jul. 27, 2022.
Corrected Notice of Allowability for U.S. Appl. No. 17/099,776, dated Jul. 21, 2022.
Office Action for U.S. Appl. No. 17/408,365, dated Aug. 2, 2022.

* cited by examiner

SELF-CONFIGURING BASEBOARD MANAGEMENT CONTROLLER (BMC)

RELATED APPLICATION DATA

This application claims the benefit of U.S. Provisional Patent Application Ser. No. 62/394,727, filed Sep. 14, 2016, which is incorporated by reference herein for all purposes.

This application is related to U.S. patent application Ser. No. 15/256,495, filed Sep. 2, 2016, which claims the benefit of U.S. Provisional Patent Application Ser. No. 62/366,622, filed Jul. 26, 2016, both of which are incorporated by reference herein for all purposes.

This application is related to U.S. patent application Ser. No. 15/345,507, filed, Nov. 7, 2016, which claims the benefit of U.S. Provisional Patent Application Ser. No. 62/394,726, filed Sep. 14, 2016, both of which are incorporated by reference herein for all purposes.

FIELD

The inventive concepts relate generally to Non-Volatile Memory Express Over Fabric (NVMeoF) systems, and more particularly to using a proxy for the host to discover installed NVMeoF devices.

BACKGROUND

Excerpts from the Non-Volatile Memory (NVM) Express (NVMe) over Fabrics (NVMeoF) specification 1.0, section 1.5.6, defines a discovery mechanism that a host may use to determine the NVM subsystems the host may access. A Discovery controller supports minimal functionality and only implements the required features that allow the Discovery Log Page to be retrieved. A Discovery controller does not implement Input/Output (I/O) queues or expose namespaces. A Discovery Service is an NVM subsystem that exposes only Discovery controllers. The method that a host uses to obtain the information necessary to connect to the initial Discovery Service is implementation specific.

The Discovery Log Page provided by a Discovery Controller contains one or more entries. Each entry specifies information necessary for the host to connect to an NVM subsystem via an NVMe Transport. An entry may specify an NVM subsystem that exposes namespaces that the host may access, or a referral to another Discovery Service. The maximum referral depth supported is eight levels.

The Baseboard Management Controller (BMC) has been widely used in servers, PCs, switches and other computer-based products. Generally speaking, the BMC depends on host processor and/or operating systems to initiate and complete the discovery process. In addition, the BMC does not care about what chassis it is in, since its main job is to monitor the health status of the system.

The sensors associated with the BMC measure internal physical variables such as temperature, humidity, power-supply voltage, fan speeds, communications parameters, and operating system (OS) functions. If any of these variables happens to stray outside specified limits, the administrator is notified. That person may then take corrective action by remote control. In some cases, the BMC may take some corrective actions such as increasing fan speeds or rebooting the failed subsystems. The monitored device/system may be power cycled or rebooted remotely, as necessary and/or appropriate. In this way, a single administrator may remotely manage numerous servers and other devices simultaneously, saving on the overall operating cost of the network and helping to ensure its reliability.

A need remains for a way for to reduce the time required for the host to identify all NVM devices in the chassis.

DETAILED DESCRIPTION

Figure 1:
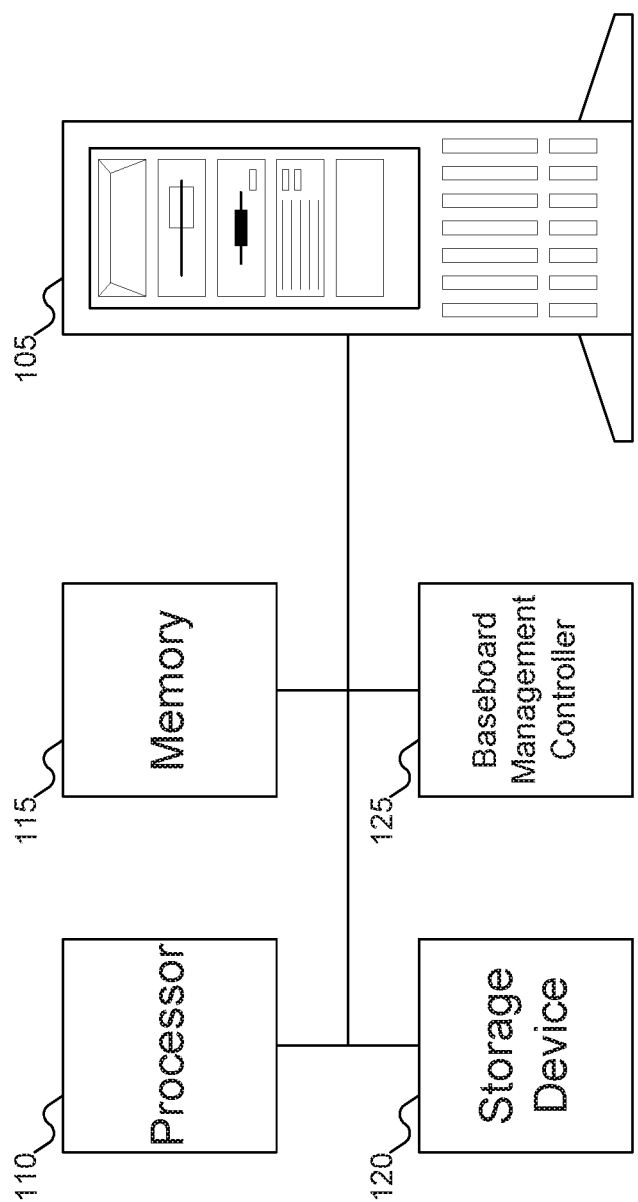
FIG. 1 shows a chassis with a self-configuring Baseboard Management Controller (BMC) installed therein that may perform discovery of Non-Volatile Memory (NVM) devices, according to an embodiment of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

U.S. patent application Ser. No. 15/256,495, filed Sep. 2, 2016, which claims the benefit of U.S. Provisional Patent Application Ser. No. 62/366,622, filed Jul. 26, 2016, both of which are incorporated by reference herein for all purposes, describes a self-discovery process by which Non-Volatile Memory (NVM) devices may perform self-discovery. This process may be extended to Baseboard Management Controllers (BMCs) that may perform self-discovery to get "Chassis Personality" information to complement self-configuring Solid-State Drives (SSDs).

The new BMC may perform the self-discovery process during boot up initialization. By reading "Chassis Personality" information from a known location of an Electrically Erasable Programmable Read Only Memory (EEPROM)—such as Vital Product Data (VPD) on the mid-plane—chassis-specific data may be obtained, and the BMC may respond appropriately. The BMC may discover, for example, whether it is in an NVM Express (NVMe) or NVMe over Fabric (NVMeoF) chassis. If the BMC is in an NVMeoF chassis, the BMC may enable appropriate NVMeoF functionalities such as Discovery Services, robust error reporting, and management capabilities, as well as multi-pathing BMCs in high availability configurations.

If the BMC self-discovery reveals that it is in an NVMe chassis, then the BMC may operate as a conventional BMC: i.e., no NMVeoF support. In NVMe mode, the drive discovery may be done through in-band PCI Express initialization/link training process. Thus, the new BMC may be used in both NVMe-based and NVMeoF-based systems.

In a large NMVeoF storage system, a BMC that may perform self-discovery may shorten the enumeration/discovery process significantly because:
  All Network-attached SSD (NASSD) devices present in the system may perform self-discovery (as disclosed in U.S. patent application Ser. No. 15/256,495, filed Sep. 2, 2016, which claims the benefit of U.S. Provisional Patent Application Ser. No. 62/366,622, filed Jul. 26, 2016, both of which are incorporated by reference herein for all purposes) independently by reading from a known location from the system much quicker than a host CPU may.
  The new BMC may perform self-discovery by reading from a known location for BMCs only, and be ready to behave appropriately in a much shorter period of time than that required by having a remote host/local processor ping/discover each device in the chassis, including the BMC.

Newer storage devices (or other devices, such as Network Interface Cards (NICs)) may use transport protocols such as NVMeoF to communicate with a chassis (also termed a host machine), and may support multiple transport protocols. When such devices are installed in a chassis, these devices may perform self-discovery during boot up and initialization. These devices may read VPD from a known location in an EEPROM: U.S. patent application Ser. No. 15/256,495, filed Sep. 2, 2016, which claims the benefit of U.S. Provisional Patent Application Ser. No. 62/366,622, filed Jul. 26, 2016, both of which are incorporated by reference herein for all purposes, describes such a self-discovery process.

Once self-discovery has started, these devices may then discover that they are installed in an NVMeoF chassis. These devices may then configure themselves to enable, for example, the Ethernet ports and disabling other unnecessary/unused/unsupported transport protocol support. In this way the operating system and host processor overhead related to multiple transport protocol discovery and management may be avoided.

In a large storage system, using such self-configuring devices may shorten the enumeration process significantly because all devices may perform self-discovery independently by reading from known location(s) from the system. The host processors and operating systems are not required to be present.

A BMC is a low-power controller embedded in servers or switches. A BMC may connect to sensors to read environmental conditions and to control devices. A BMC has all the connections to all NVMeoF devices via the control plane/path. Therefore, it is advantageous to use a BMC as a proxy for providing discovery services to the host or initiator. Due to its interaction with many devices, a BMC may serve as a Discovery Controller to provide a list of NVM subsystems that are accessible to the host.

The BMC presented herein may have firmware to perform discovery of eSSDs, Network-Attached Solid State Drives, or other devices inserted into the system. Network-Attached SSDs may include Ethernet SSDs, InfiniBand SSDs, Fibre-Channel SSDs, SSDs, or SSDs that offer a combination of these transport protocols (Ethernet, InfiniBand, and Fibre-Channel). Ethernet, InfiniBand, and Fibre-Channel transport protocols are merely exemplary, and embodiments of the inventive concept may include Network-Attached SSDs that support other transport protocols. The BMC may directly access each device through a private bus and a Complex Programmable Logic Device (CPLD). The BMC may also read a known non-volatile memory location on the mid-plane where each device reports its information. This method may shorten the enumeration process. The BMC may store each device's information as a Discovery Log Page in its non-volatile memory.

The BMC may communicate with devices using a control plane. The control plane, the data plane and the management plane are the three basic components of telecommunications products. The control plane is the part of a network that carries signaling traffic and is responsible for routing. Functions of the control plane include system configuration and management. The control plane and management plane serve the data plane, which bears the traffic that the network exists to carry. The management plane, which carries administrative traffic, is considered a subset of the control plane.

A new Intelligent Platform Management Interface (IPMI) command (System Discovery) may be supported by the BMC's firmware for local or remote hosts to retrieve this Discovery Log Page. Remote hosts may connect to the BMC through its Local Area Network (LAN) interface if they are in the same network. Remote hosts may also connect to the BMC's local host. Each entry in the Discovery Log Page may specify information necessary for the host to connect to an NVM subsystem via an NVMe Transport.

The NVMeoF standard specifies Discovery service may be performed via Ethernet links or via the data plane. In contrast, embodiments of the inventive concept use the BMC as a proxy, which enables discovery services to be performed via the control plane. In networking, the control plane is typically limited to only a system administrator, and is better protected than data plane, which may be accessed by many people/nodes. In terms of security, the control plane is better protected than data plane. In addition, system administrators may issue one command to a BMC to get all discovery log files from all NVMeoF devices instead of issuing one command per device, as specified by the standard.

FIG. 1 shows a chassis with a self-configuring Baseboard Management Controller (BMC) installed therein that may perform discovery of Non-Volatile Memory (NVM) devices, according to an embodiment of the inventive concept. In FIG. 1, chassis 105 is shown as a tower server, but chassis 105 may just as easily be a rack server.

Chassis 105 may include processor 110, memory 115, storage device 120, and BMC 125. Processor 110 may be any variety of processor: for example, an Intel Xeon, Celeron, Itanium, or Atom processor, an AMD Opteron processor, an ARM processor, etc. While FIG. 1 shows a single processor, chassis 105 may include any number of processors. Memory 115 may be any variety of memory, such as flash memory, Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc., but is typically DRAM. Memory 115 may also be any desired combination of different memory types.

Storage device 120 may be any variety of storage device. Examples of such devices may include Solid State Drives (SSDs), but other storage forms, such as hard disk drives or other long-term storage devices, are also viable. BMC 125, as described above, may operate as a conventional BMC, but may also be self-configuring based on the configuration of chassis 105. For example, chassis 105 may be an NVMe chassis, or an NVMeoF chassis. With chassis 105 as an NVMe chassis, BMC 125 may operate as a conventional NVMe BMC after self-configuration. With chassis 105 as an NVMeoF chassis, BMC 125 may also operate as a conventional BMC, but it may also perform discovery of other devices within chassis 105, such as storage device 120, Network Interface Cards (NICs), and any other devices that may, like BMC 125, be subject to discovery.

While BMC 125 is described as being able to perform discovery of other devices in chassis 105, BMC 125 is one possible proxy for processor 110 performing the discovery. Other possible proxies may include a Redundant Array of Independent Disks (RAID) controller, another processor (typically different from processor 110, which would be involved in performing start-up operations), or even a software proxy. For the remainder of this document, any reference to BMC 125 is intended to also refer to these other proxy devices, as well as any other devices that may act as a proxy for processor 110.

Figure 2:
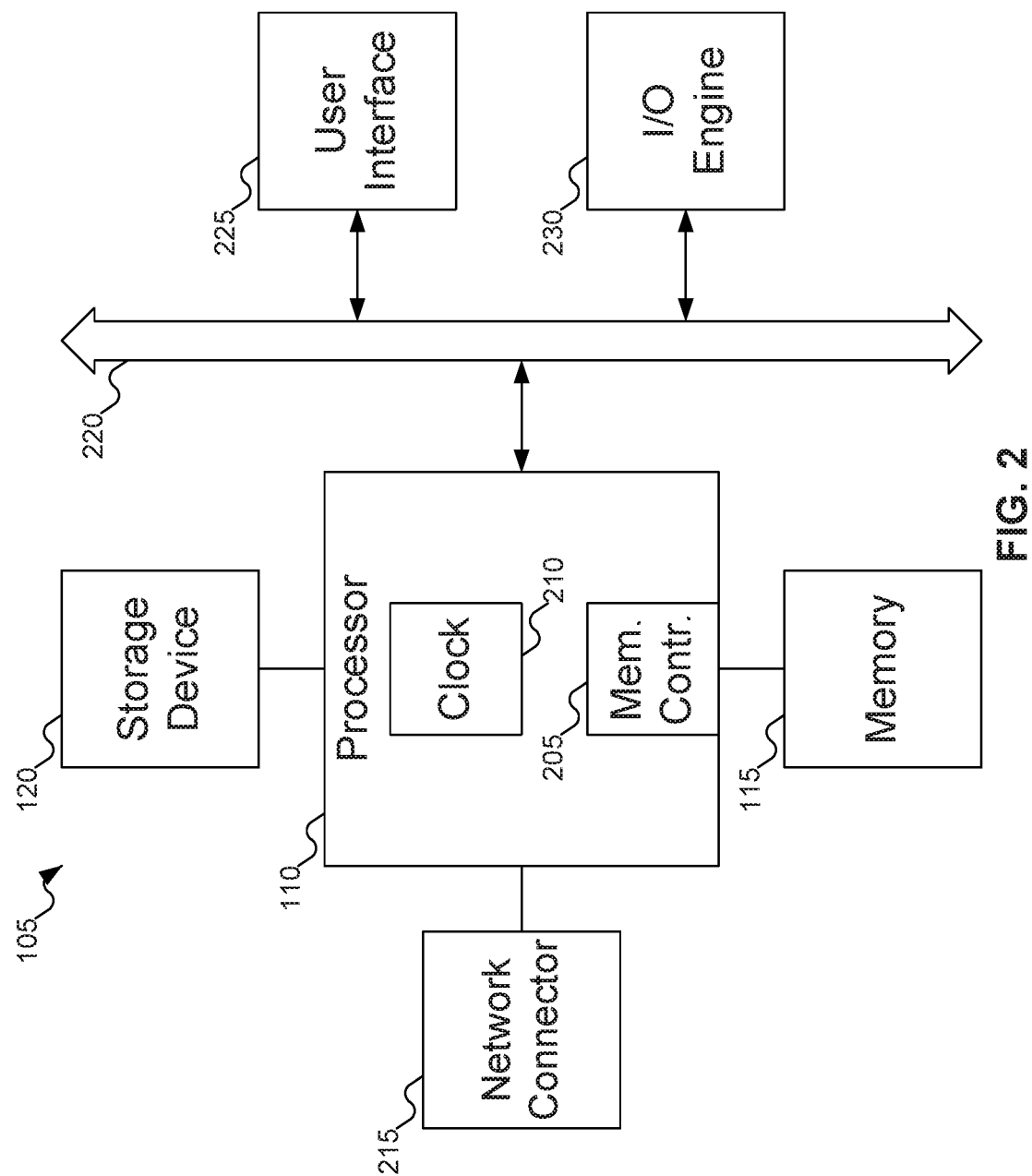
FIG. 2 shows additional details of the chassis of FIG. 1.

FIG. 2 shows additional details of the chassis of FIG. 1. Referring to FIG. 2, typically, chassis 105 includes one or more processors 110, which may include memory controller 205 and clock 210, which may be used to coordinate the operations of the components of chassis 105. Processors 110 may also be coupled to memory 115, which may include random access memory (RAM), read-only memory (ROM), or other state preserving media, as examples. Processors 110 may also be coupled to storage devices 120, and to network connector 215, which may be, for example, an Ethernet connector or a wireless connector. Processors 110 may also be connected to a bus 220, to which may be attached user interface 225 and input/output interface ports that may be managed using input/output engine 230, among other components.

Figure 3:
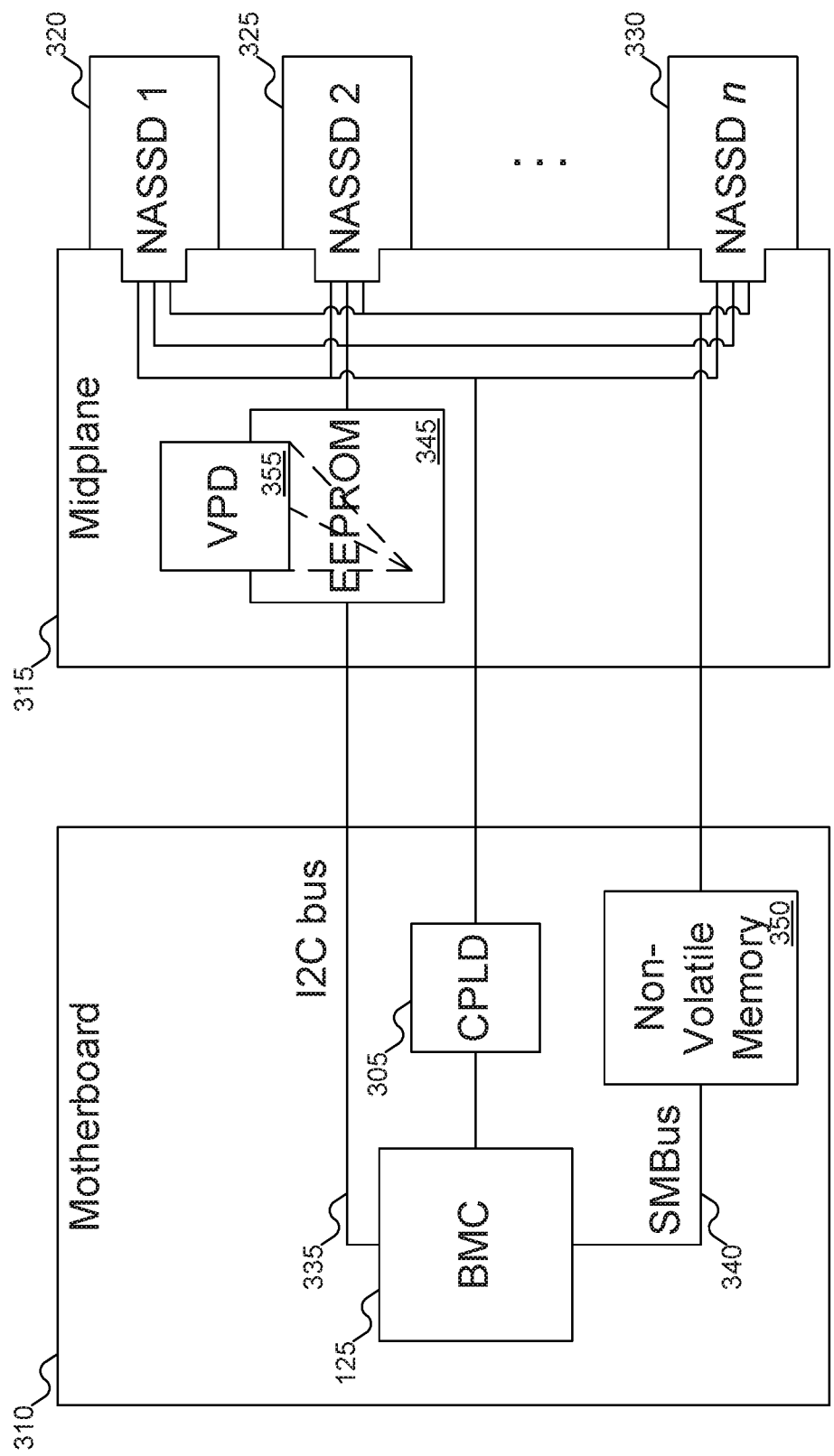
FIG. 3 shows the BMC of FIG. 1 communicating with devices on a mid-plane of the chassis of FIG. 1.

FIG. 3 shows BMC 125 of FIG. 1 communicating with devices on a mid-plane of chassis 105 of FIG. 1. In FIG. 3, BMC 125 and Complex Programmable Logic Device (CPLD) 305 may be situated on motherboard 310 within chassis 105 of FIG. 1. Chassis 105 of FIG. 1 may also include midplane 315. Midplane 315 may include other components, such as various Network-Attached SSDs 320, 325, and 330, which are examples of storage device 120 of FIG. 1. Network-Attached SSDs 320, 325, and 330 may support using any of a number of different transport protocols, such as Ethernet, Fibre Channel, InfiniBand, or Non-Volatile Memory Express (NVMe), to name a few possibilities, but in some embodiments of the inventive concept Network-Attached SSDs 320, 325, and/or 330 may be limited to a subset of these transport protocols (possibly one: for example, an Ethernet SSD). While FIG. 3 shows three Network-Attached SSDs 320, 325, and 330, embodiments of the inventive concept may support any desired number of devices. In addition, while FIG. 3 shows only Network-Attached SSDs 320, 325, and 330, other devices, such as Ethernet SSDs or NICs may be substituted for or included in addition to Network-Attached SSDs 320, 325, and 330. In the remainder of this document, any reference to Network-Attached SSDs 320, 325, and 330 is intended to encompass any alternative device that may be subject to discovery as an NVMeoF device and may be substituted for Network-Attached SSDs 320, 325, and 330.

BMC 125 may communicate with Network-Attached SSDs 320, 325, and 330 over I2C bus 335 and SMBus 340. Network-Attached SSDs 320, 325, and 330 may also communicate with EEPROM 345 and NVM 350. NVM 350 may act as memory 115 of FIG. 1; EEPROM 345 may store information for use by various devices in chassis 105 of FIG. 1. For example, EEPROM 345 may store VPD 355. VPD 355 may be used by Network-Attached SSDs 320, 325, and 330, and by BMC 125, to store information pertinent to those devices. More particularly, EEPROM 345 may store separate VPD 355 for each such device.

VPD 355 has several uses. In some embodiments of the inventive concept, VPD 355 may be used to store pertinent information for each device, which may be used in self-configuration. Thus, VPD 355 may store information used by Network-Attached SSDs 320, 325, and 330 to self-configure, as described in U.S. patent application Ser. No. 15/256,495, filed Sep. 2, 2016, which claims the benefit of U.S. Provisional Patent Application Ser. No. 62/366,622, filed Jul. 26, 2016, both of which are incorporated by reference herein for all purposes. But in other embodiments of the inventive concept, VPD 355 may also store information used by BMC 125 to perform its own self-configuration, as described below. In addition, in yet other embodiments of the inventive concept, Network-Attached SSDs 320, 325, and 330 may write information to VPD 355, which BMC 125 may then read. For example, Network-Attached SSDs 320, 325, and 330 may write their IP addresses to VPD 355, which BMC 125 may then read from VPD 355. Then, when host 110 of FIG. 1 queries BMC 125 for information, BMC 125 may provide the configuration information for Network-Attached SSDs 320, 325, and 330.

While FIG. 3 shows EEPROM 345 on midplane 315 and NVM 350 on motherboard 310, embodiments of the inventive concept may support these components (and other components as well) being placed anywhere desired. For example, in some embodiments of the inventive concept, EEPROM 345 and NVM 350 may both be located on midplane 315, in other embodiments of the inventive concept they may both be located on motherboard 310, and in yet other embodiments of the inventive concept NVM 350 may be on midplane 315 and EEPROM 345 on motherboard 310. Other embodiments of the inventive concept may place such components in yet other locations: for example, on another board within chassis 105 of FIG. 1, or possibly in another chassis entirely.

Figure 4:
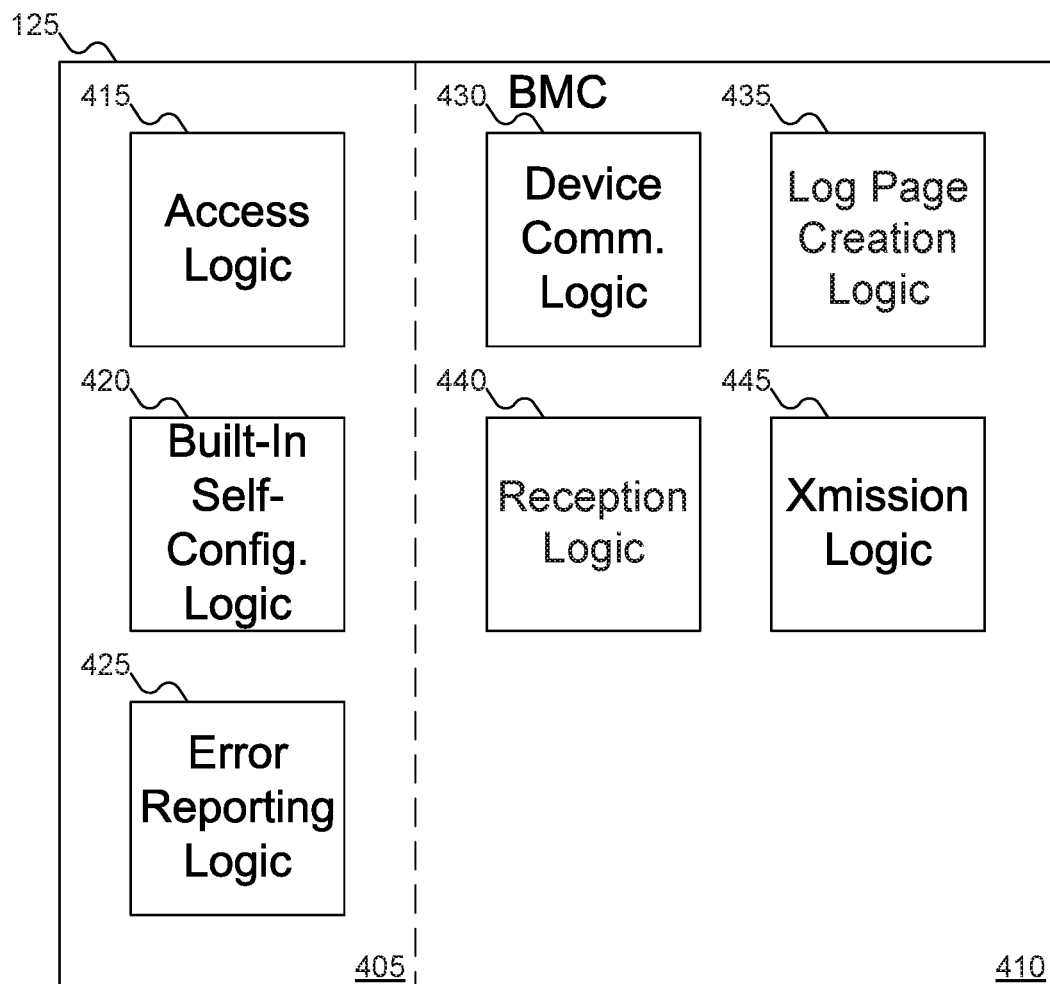
FIG. 4 shows details of the BMC of FIG. 1.

FIG. 4 shows details of BMC 125 of FIG. 1. In FIG. 4, BMC 125 is shown divided into two portions 405 and 410. Portion 405 relates to BMC 125 performing self-configuration in some embodiments of the inventive concept; portion 410 relates to BMC 125 acting as a proxy for host 110 of FIG. 1 in other embodiments of the inventive concept. Note that embodiments of the inventive concept may include one or both of portions 405 and 410, as desired.

To perform self-configuration, BMC 125 may include access logic 415, built-in self-configuration logic 420, and error reporting logic 425. Access logic 415 may access information about how BMC 125 is to configure itself. Access logic 415 is described further with reference to FIG. 5 below. Built-in self-configuration logic 420 may configure BMC 125 to use the appropriate driver based on the configuration of chassis 105 of FIG. 1. Built-in self-configuration logic 420 is described further with reference to FIG. 8 below. Error reporting logic 425 may report an error to host 110 of FIG. 1 when there is a problem. Examples of problems that BMC 125 might report to host 110 of FIG. 1 may include when chassis 105 of FIG. 1 is a High Availability chassis but BMC 125 may not access or load a High Availability driver, or when BMC 125 may not communicate with its pairing partner as a High Availability system.

To act as a discovery proxy for host 110 of FIG. 1, BMC 125 may include device communication logic 430, Log Page creation logic 435, reception logic 440, and transmission logic 445. Device communication logic 430 may enable BMC 125 to communicate with devices, such as Network-Attached SSDs 320, 325, and 330 of FIG. 3, to learn about their configuration. Device communication logic 430 is described further with reference to FIG. 10 below. Log Page creation logic 435 may take the information received from Ethernet devices 320, 325, and 330 of FIG. 3, and create a Discovery Log Page, that may be reported to host 110 of FIG. 1 at an appropriate time. Log Page creation logic 435 may either simply collate the information received from Ethernet devices 320, 325, and 330 of FIG. 3, or it may eliminate repeated information from Network-Attached SSDs 320, 325, and 330 of FIG. 3 by assembling the Log Page. The structure of a Log Page is described in the NVM Express over Fabrics specification, revision 1.0, dated Jun. 5, 2016, which is hereby incorporated by reference for all purposes.

In some embodiments of the inventive concept, BMC 125 may have its own storage: for example, in NVM 350 of FIG. 3, or in EEPROM 345 of FIG. 3 among other possibilities. Network-Attached SSDs 320, 325, and 330 of FIG. 3 may write their configuration information directly into a Log Page maintained in this storage for BMC 125.

Reception logic 440 and transmission logic 445 enable communication with host 110 of FIG. 1. For example, reception logic 440 may receive a query from host 110 of FIG. 1 regarding Network-Attached SSDs 320, 325, and 330 of FIG. 3; transmission logic 445 may send a response back to host 110 of FIG. 1 responsive to such a query. Note that reception logic 440 and transmission logic 445 are not required to be dedicated to the purposes described above: they may be used for other purposes as well. For example, as described below with reference to FIG. 10, device communication logic 430 may send messages to Network-Attached SSDs 320, 325, and 330 of FIG. 3: these messages may be sent using transmission logic 445 (and responses to these messages may be received using reception logic 440).

Figure 5:
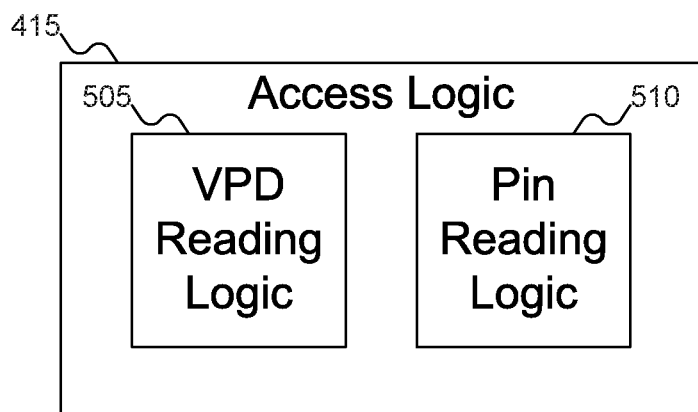
FIG. 5 shows details of the access logic of FIG. 4.

FIG. 5 shows details of access logic 415 of FIG. 4. In FIG. 5, access logic 415 may include VPD reading logic 505 and pin reading logic 510. VPD reading logic 505 may read information from VPD 355 of FIG. 3, which may be a VPD specific to BMC 125. The information in VPD 355 of FIG. 3 may include the configuration of chassis 105 of FIG. 1. Pin reading logic 510, on the other hand, may determine the configuration of chassis 105 of FIG. 1 by reading one or more signals on one or more pins of BMC 125 of FIG. 1. These pins of BMC 125 of FIG. 1 may be dedicated to specifying the configuration of chassis 105 of FIG. 1.

Figure 6:
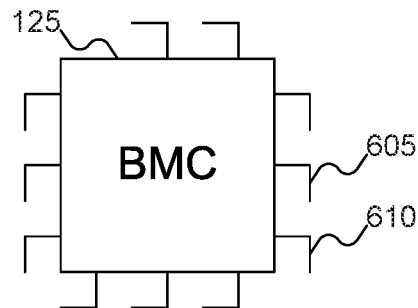
FIG. 6 shows the BMC of FIG. 1 with pins for signaling.

FIG. 6 shows an example of BMC 125 of FIG. 1 with pins for signaling. In FIG. 6, BMC 515 is shown as including a variety of pins. Pins 605 and 610 may be used to specify the configuration of chassis 105 of FIG. 1: based on the values signaled on these pins, BMC 125 may determine the configuration of chassis 105 of FIG. 1. Pins 605 and 610 may be general purpose input/output (GPIO) pins, among other possibilities.

Returning to FIG. 5, pin reading logic 510 may use the information read from pins 605 and 610 of FIG. 6 to determine the configuration of chassis 105 of FIG. 1 and load the appropriate driver. For example, as described below with reference to FIG. 8, there may be three different configurations of chassis 105 of FIG. 1: NVMe, NVMeoF, and High Availability. To choose between three different possibilities may require two bits, which could require signals to be sent on two pins. If the two pins specify the value 00, that combination may specify that chassis 105 of FIG. 1 is an NVMe chassis. If the two pins specify the value 01, that combination may specify that chassis 105 of FIG. 1 is an NVMeoF chassis. And if the two pins specify the value 10, that combination may specify that chassis 105 of FIG. 1 is a High Availability chassis.

Alternatively, three possibilities could be managed by a single pin. For example, a 0 value could specify an NVMe chassis, a 1 value could specify an NVMeoF chassis, and an oscillation between 0 and 1 could specify a High Availability chassis. But if there are more than three combinations, it is likely that more than one pin would be needed to specify the chassis configuration.

While the above example describes three possibilities—NVMe, NVMeoF, and High Availability—in other embodiments of the inventive concept there may be four driver configurations—NVMe, NVMeoF, NVMe High Availability, and NVMeoF High Availability. In such an embodiment of the inventive concept, for example, a high value on pin 605 may indicate that chassis 105 of FIG. 1 is a High Availability chassis and a low value on pin 605 may indicate that chassis 105 of FIG. 1 is not a High Availability chassis, whereas a high value on pin 610 may indicate that chassis 105 of FIG. 1 uses NVMeoF and a low value on pin 610 may indicate that chassis 105 of FIG. 1 uses NVMe. And in yet other embodiments of the inventive concept there may be even more different driver types. Embodiments of the inventive concept are may encompass any number of driver types as desired.

In FIG. 5, VPD reading logic 505 and pin reading logic 510 represent alternative ways for BMC 125 of FIG. 1 to determine the configuration of chassis 105 of FIG. 1. Thus, access logic 415 might include one or the other, and not necessarily both. However, embodiments of the inventive concept could include both VPD reading logic 505 and pin reading logic 510, to support BMC 125 of FIG. 1 being able to determine the configuration of chassis 105 of FIG. 1 in different ways.

Figure 7:
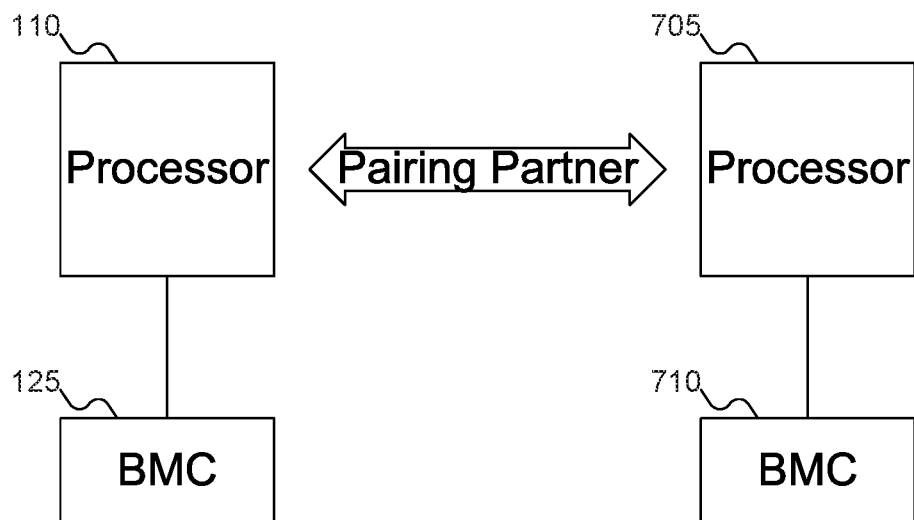
FIG. 7 shows the chassis of FIG. 1 in a High Availability configuration.

High Availability chassis have now been mentioned a couple of times. FIG. 7 shows chassis 105 of FIG. 1 in a High Availability configuration. Processor 110 and BMC 125 may be paired with another processor 705 and another BMC 710. In some embodiments of the inventive concept, processor 705 may be in chassis 105 of FIG. 1, and in other embodiments of the inventive concept processor 705 may be in a different chassis. Processor 110 may maintain communication with processor 705, and BMC 125 may maintain communication with BMC 710. This communication may include a heartbeat: if one of BMC 125 and BMC 710 do not respond, then the other BMC knows that there is an error. Pairing partners may communicate, for example, over Peripheral Component Interconnect Express (PCIe) or Ethernet, among other possibilities.

If a pairing partner fails—for example, one of the chassis loses power—the remaining processor may enable the takeover path, permitting the remaining BMC to establish communication and cross the domain. Since the BMC in the failed chassis may run on standby power, the surviving processor may talk to the BMC of the failed chassis. The surviving processor may try to reset the failed processor, in the hopes that the failed processor may be restarted. If the failed processor may not be reset, the surviving processor may send an alert or interrupt to the host that oversees the failed chassis. A third party software or agent may then elect an available working node to become the new pairing partner of the surviving node.

Because of the need for heartbeat communication and for the surviving node to take over for the failed node, the driver needed for a High Availability chassis is different from the driver used in a non-High Availability chassis. Thus, BMC 125 operates differently in a High Availability chassis than in a non-High Availability chassis.

Until the High Availability driver is loaded into BMC 125, it might happen that BMC 125 may not see its pairing partner. Thus, in some embodiments of the inventive concept, the High Availability driver should be loaded even though BMC 125 might not yet be able to communicate with its pairing partner, and checking for the pairing partner should occur after the High Availability driver is loaded.

Figure 8:
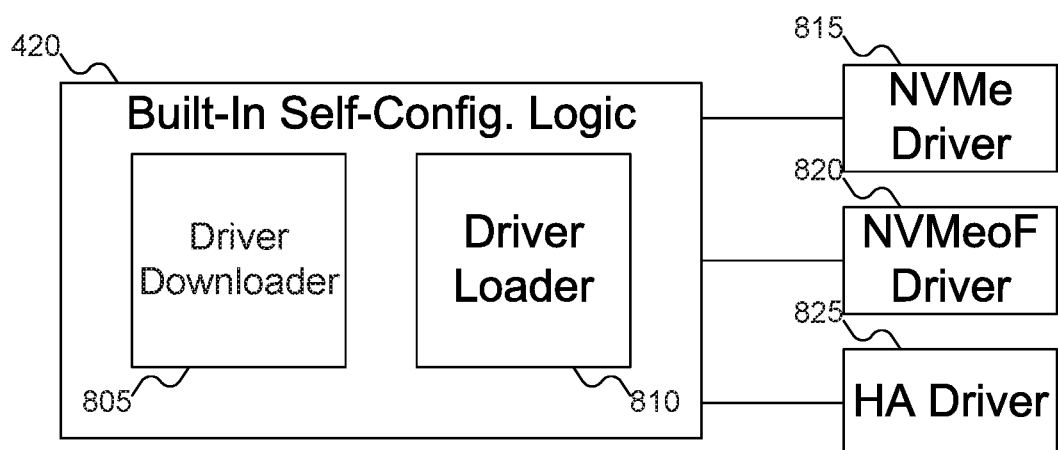
FIG. 8 shows the built-in self-configuration logic of FIG. 4.

FIG. 8 shows built-in self-configuration logic 420 of FIG. 4. As described above, built-in self-configuration logic 420 may take the information determined by access logic 415 of FIG. 4 and configure BMC 125 of FIG. 1 accordingly. Built-in self-configuration logic 420 may include driver downloader 805 and driver loader 810. Driver downloader 805 may download an appropriate driver, such as NVMe driver 815, NVMeoF driver 820, and High Availability driver 825 from a driver source. Note that the driver source might be within the firmware of BMC 125 of FIG. 1, in which case the driver does not need to be "downloaded" at all, but rather just read from the firmware. Once downloaded or otherwise located, driver loader 810 may then load the selected driver into BMC 125.

Figure 9:
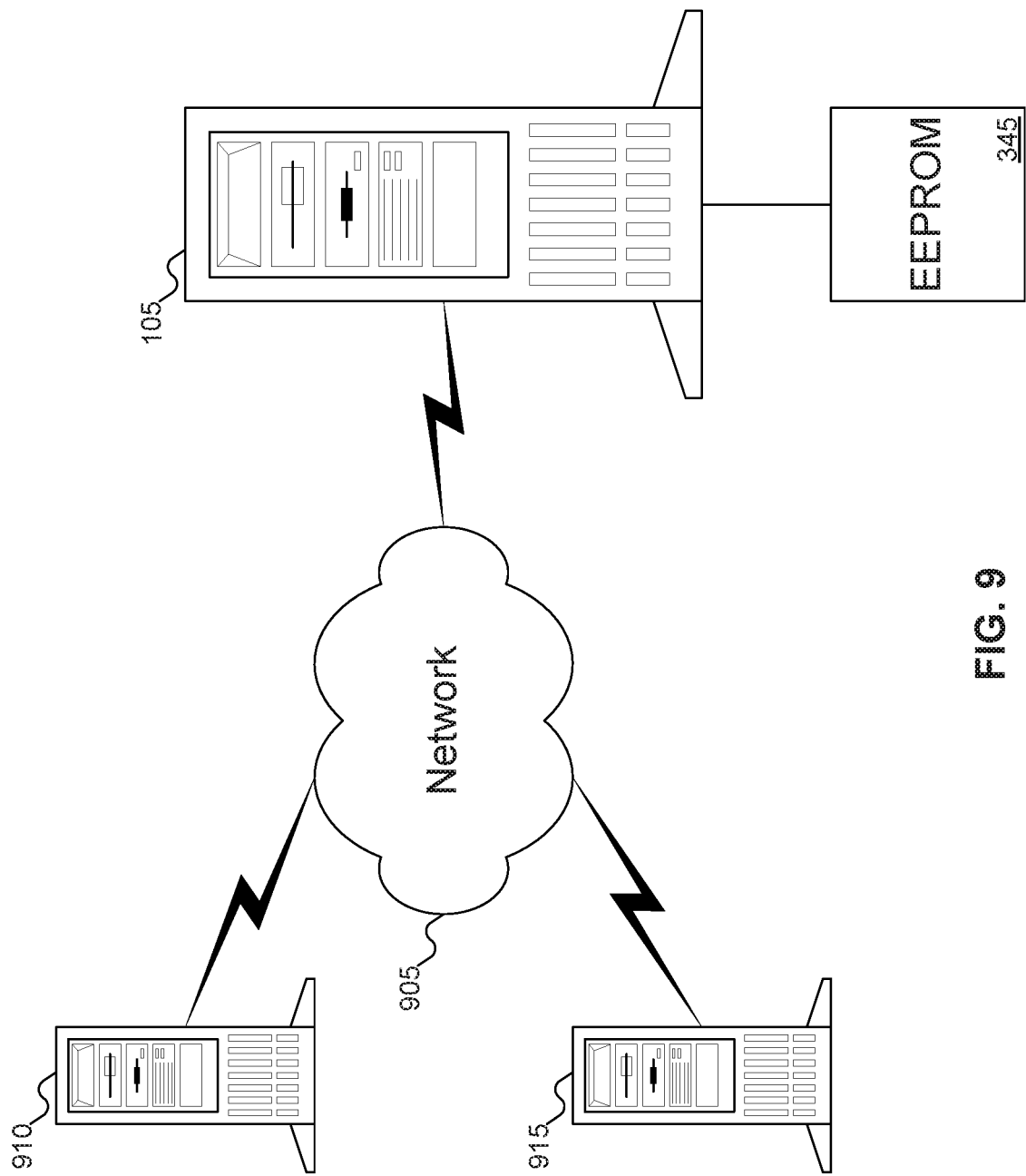
FIG. 9 shows various sources for the drivers of FIG. 8.

FIG. 9 shows various sources for the drivers of FIG. 8. In FIG. 9, chassis 105 may include EEPROM 345, which may be a driver source. In such embodiments of the inventive concept, the appropriate driver may be stored in EEPROM 345 and read from there as needed.

Chassis 105 is also shown as connected to network 905. Network 905 may permit communication between chassis 105 and machines 910 and 915. Machine 910 may be a machine on a Local Area Network (LAN), whereas machine 915 may be a machine on a global network, such as the Internet. Regardless of what source exists for the selected driver, however, driver downloader 805 of FIG. 8 may download (or read) the appropriate driver from the driver source, enabling driver loader 810 of FIG. 8 to then load the driver into BMC 125 of FIG. 1.

Figure 10:
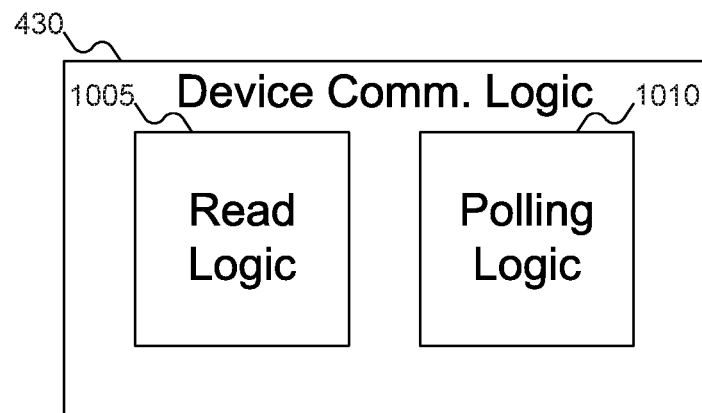
FIG. 10 shows the device communication logic of FIG. 4.

FIG. 10 shows device communication logic 430 of FIG. 4. In FIG. 10, device communication logic 430 may include read logic 1005 and polling logic 1010. BMC 125 of FIG. 1 may use read logic 1005 to read information, such as the configuration of one of Network-Attached SSDs 320, 325, and 330 of FIG. 3, from VPD 355 of FIG. 3. BMC 125 may also use read logic 1005 to read new information from VPD 355, if Network-Attached SSDs 320, 325, and 330 send a message to BMC 125 of FIG. 1 indicating that new information is available.

In contrast, BMC 125 of FIG. 1 may using polling logic 1010 to poll Network-Attached SSDs 320, 325, and 330 of FIG. 3 periodically. In embodiments of the invention where Network-Attached SSDs 320, 325, and 330 of FIG. 3 do not notify BMC 125 of FIG. 1 about changes in their configuration, BMC 125 of FIG. 1 may use polling logic 1010 to query Network-Attached SSDs 320, 325, and 330 about their current information, and whether any information has changed. Network-Attached SSDs 320, 325, and 330 may then reply, indicating whether their configurations have changed and, if so, how they have changed.

Figure 11:
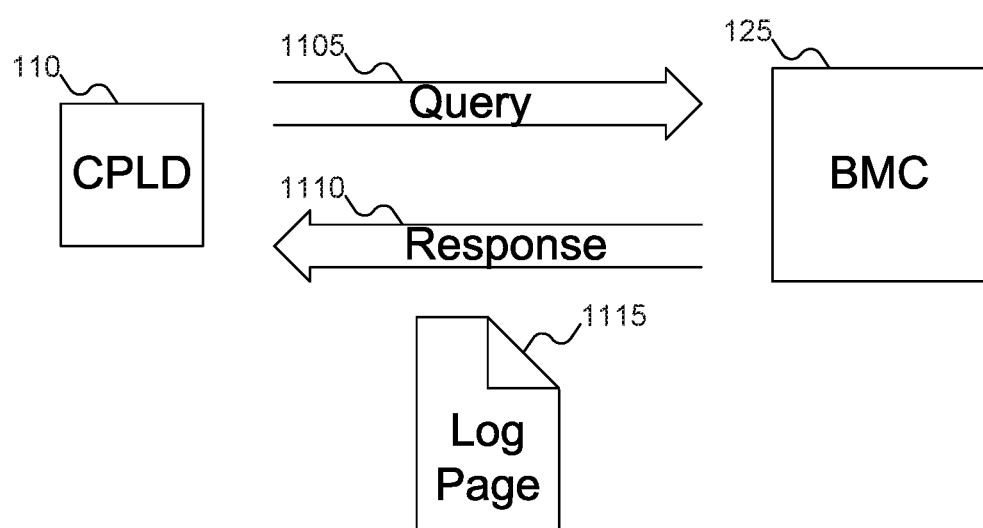
FIG. 11 shows the host of FIG. 1 requesting a Discovery Log Page from the BMC of FIG. 1.

FIG. 11 shows host 110 of FIG. 1 requesting a Discovery Log Page from BMC 125 of FIG. 1. In FIG. 11, host 110 may send query 1105 to BMC 125. Typically, query 1105 is sent when host 110 is ready to receive the configuration information of BMC 125, which may be some interval of time after BMC 125 has collected and assembled the configuration information for Network-Attached SSDs 320, 325, and 330. BMC 125 may then respond by with response 1110, which may include Log Page 1115. In this manner, BMC 125 may provide host 110 with information about all the devices installed in chassis 105, or at least, all the devices in the domain of the BMC. 125. For example, a single chassis 105 of FIG. 1 might have two motherboards (either two half-width motherboards or two stacked full-width motherboards, for example), each with its own BMC and attached devices. In such a scenario, each BMC is responsible for collecting the information about the devices in its domain, but not for collecting the information about the devices in the other BMC's domain, even though they are all within the same chassis.

Embodiments of the inventive concept have a technical advantage over conventional systems in that they may expedite the process of starting the machine. In conventional systems, the host must query each device in turn for its configuration information, but it may not do so until after it has done a number of other start-up operations. The BMC, in contrast, may start up much more quickly, and may act as a proxy for the host, querying the various devices for their configuration (while the host is busy performing other start-up procedures). Then, when the host is ready, the host may query the BMC for the configuration information, and may learn about all attached devices much more quickly. In addition, as compared with conventional Discovery Services performed using the data plane, performing discovery services via BMC 125 on the control plane is more secure and does not consume any bandwidth on the data plane.

Another technical advantage that embodiments of the inventive concept have over conventional systems is that the host only needs to issue one command to the BMC to perform discovery of all devices present in the chassis. For example, if the chassis includes 24 devices, the host may issue a "discovery all devices" command to the BMC: the BMC may discover the 24 devices. This approach avoids the host issuing 24 discovery commands to the 24 devices, as in the conventional system.

Figure 12A:
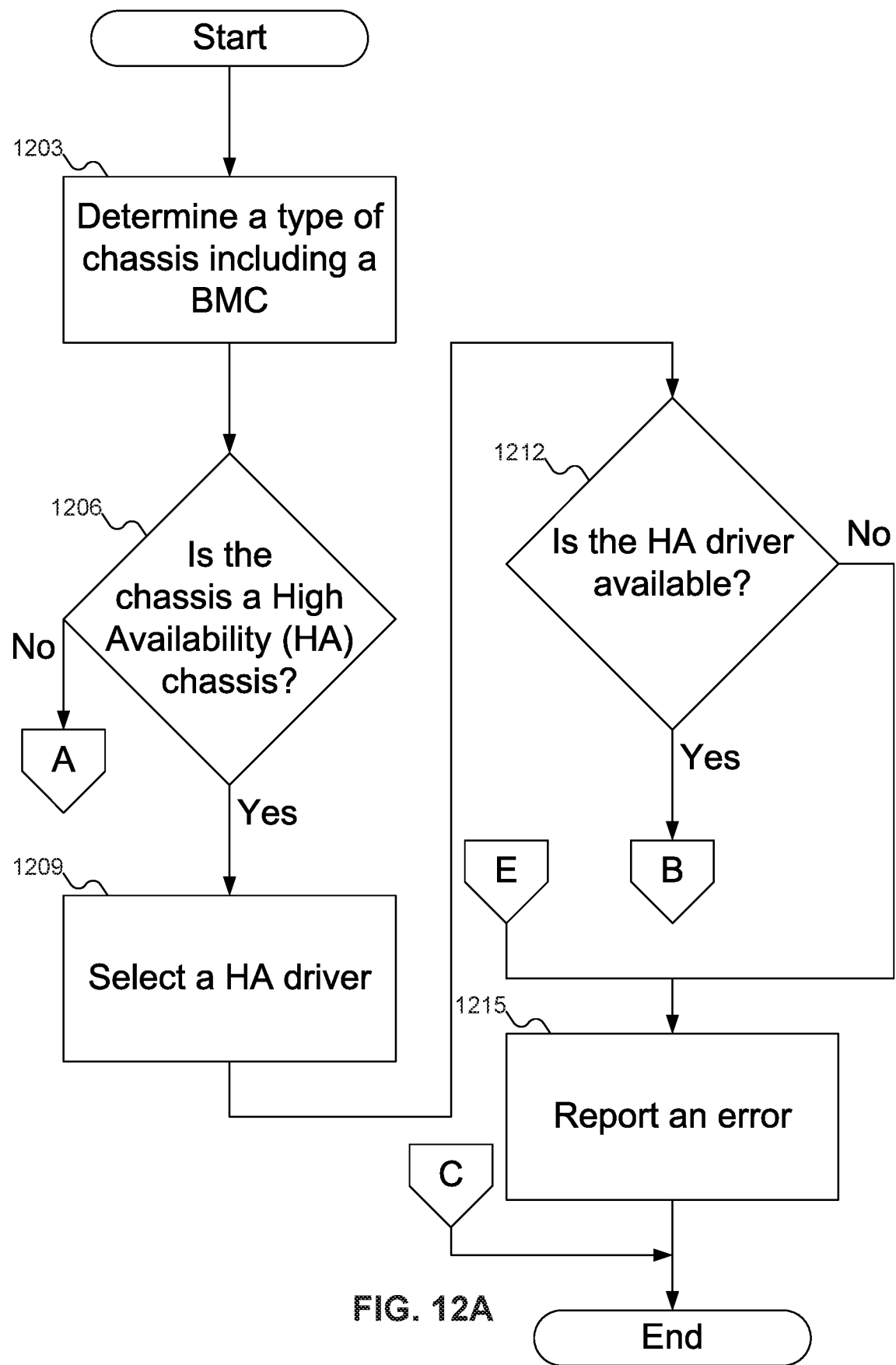
FIGS. 12A-12D show a flowchart of an example procedure for the BMC of FIG. 1 to self-configure, according to an embodiment of the inventive concept.
Figure 12B:
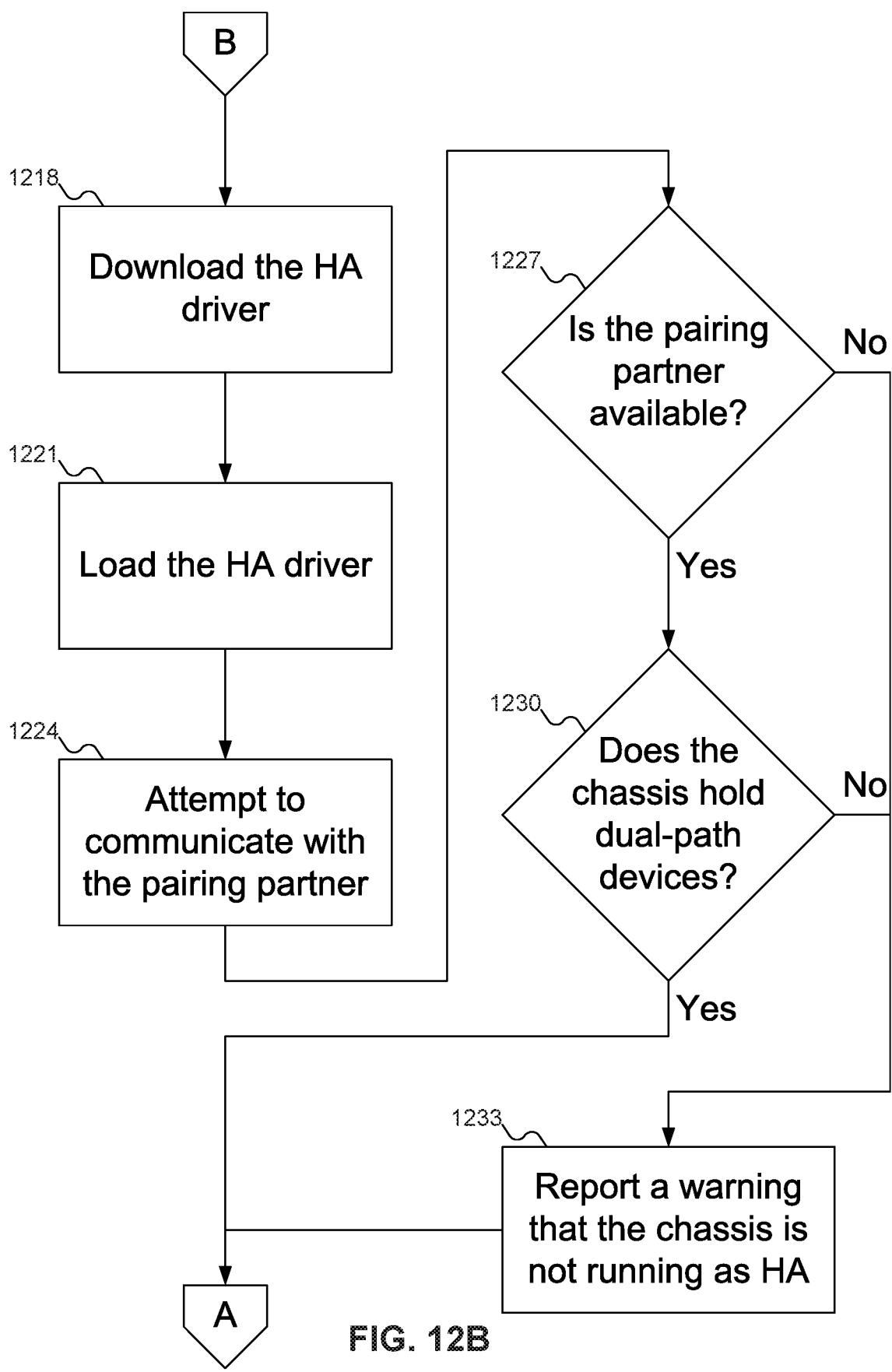
Figure 12C:
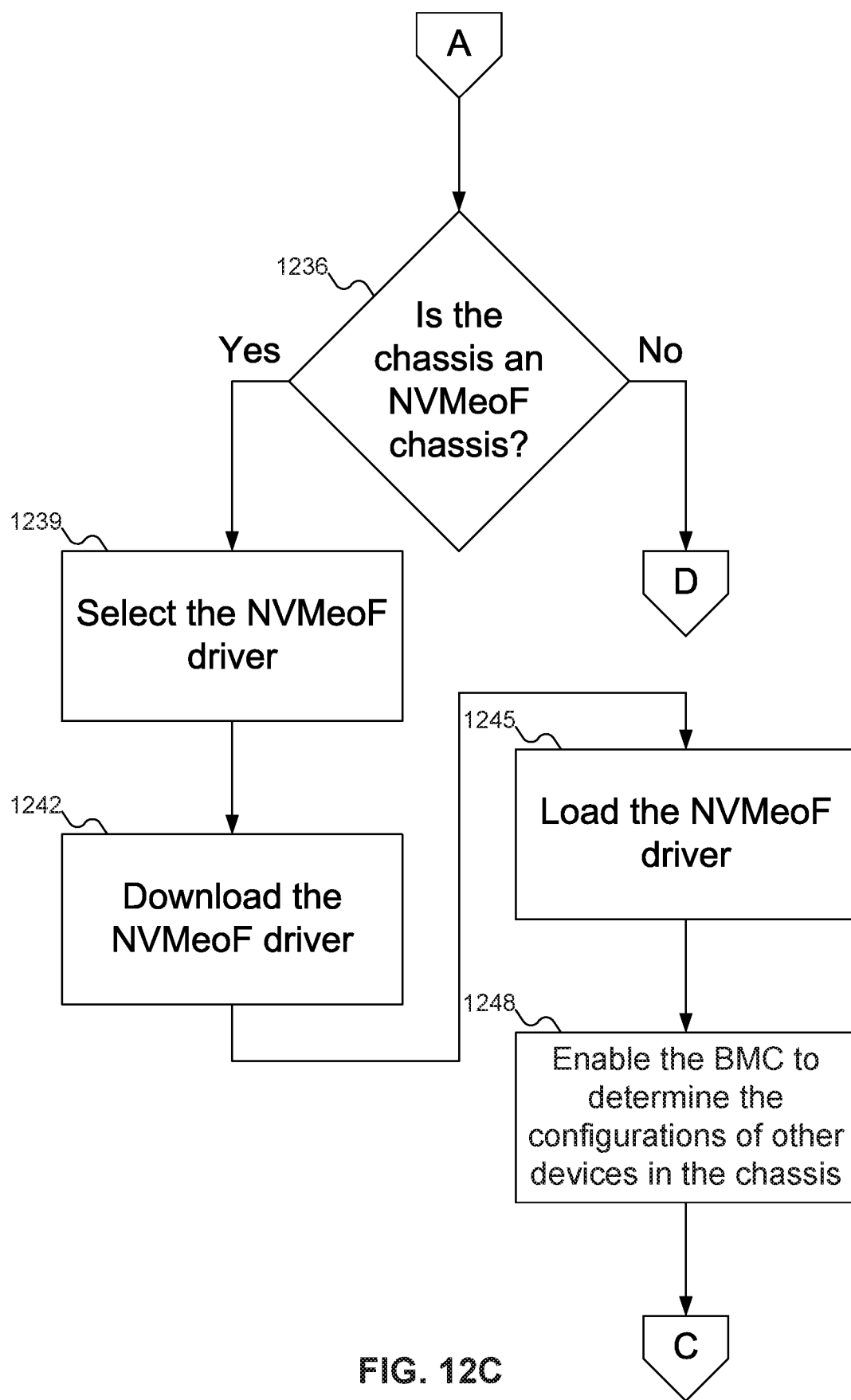
Figure 12D:
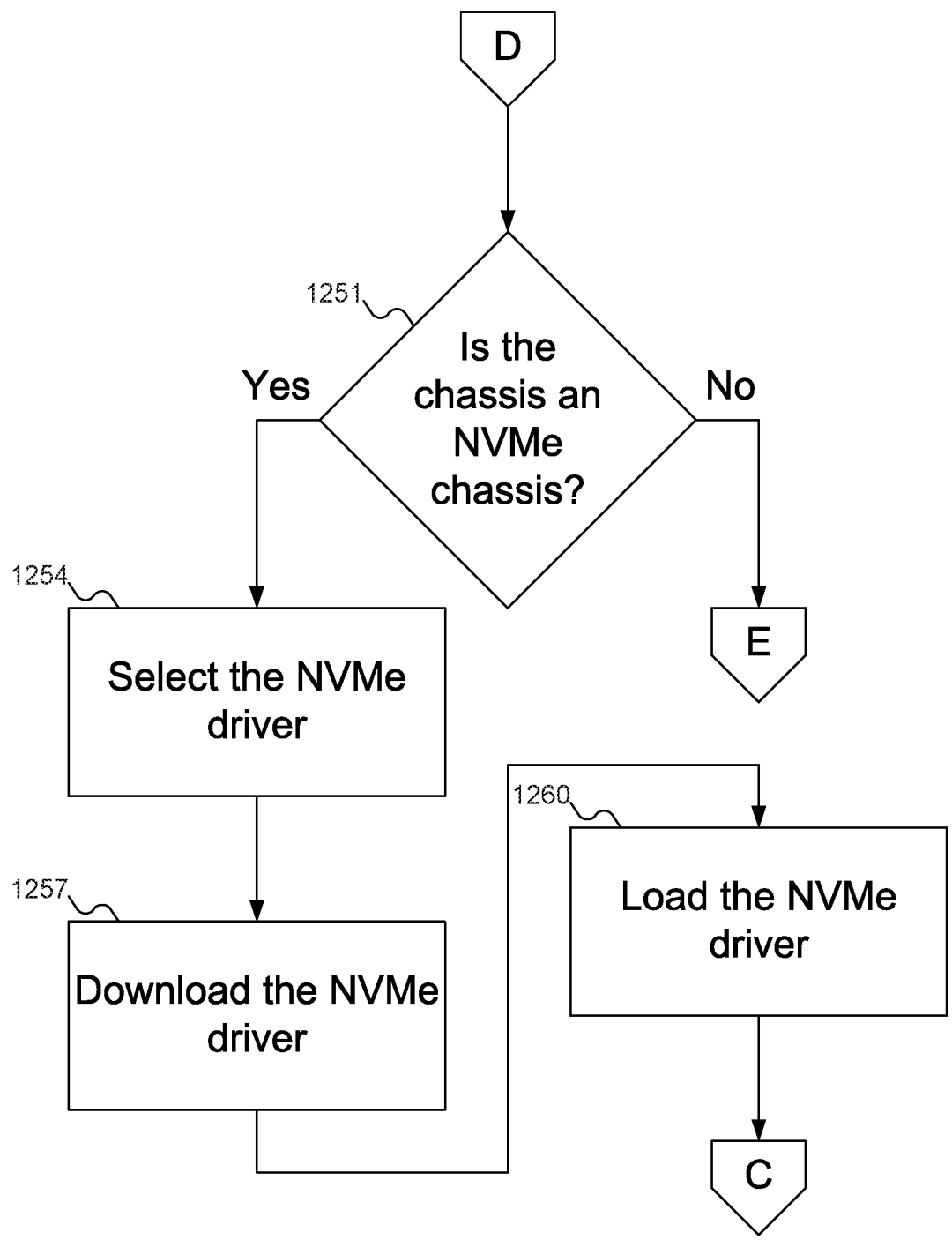

FIGS. 12A-12D show a flowchart of an example procedure for BMC 125 of FIG. 1 to self-configure, according to an embodiment of the inventive concept. In FIG. 12A, at block 1203, access logic 415 of FIG. 4 may determine a configuration of chassis 105 of FIG. 1: NVMe, NVMeoF, or High Availability. At block 1206, BMC 125 of FIG. 1 may determine if chassis 105 of FIG. 1 is a High Availability chassis (which may include multiple flavors, such as NVMe or NVMeoF). If chassis 105 of FIG. 1 is not a High Availability chassis, then processing may continue at block 1236 (FIG. 12C).

Continuing with FIG. 12A, if chassis 105 of FIG. 1 is a High Availability chassis, then at block 1209 built-in self-configuration logic 420 of FIG. 4 may select High Availability driver 825 of FIG. 8. At block 1212, built-in self-configuration logic 420 of FIG. 4 may determine if High Availability driver 825 of FIG. 8 is available. If not, then at block 1215, error reporting logic 425 of FIG. 4 may report an error.

If High Availability driver 825 of FIG. 8 is available, then at block 1218 (FIG. 12B) driver downloader 805 of FIG. 8 may download High Availability driver 825 of FIG. 8, and at block 1221 driver loader 810 of FIG. 8 may load High Availability driver 825 of FIG. 8.

At block 1224, BMC 125 of FIG. 1 may attempt to communicate with its pairing partner (BMC 710 of FIG. 7). At block 1227, BMC 125 of FIG. 1 may determine if its pairing partner is available. If the pairing partner of BMC 125 of FIG. 1 is available, then at block 1230, BMC 125 of FIG. 1 may determine whether the devices installed in chassis 105 of FIG. 1 are dual-path devices. If BMC 125 of FIG. 1 may not determine that its pairing partner is available (block 1227) or the devices installed in chassis 105 of FIG. 1 are not dual-path devices (block 1230), then at block 1233 BMC 125 of FIG. 1 may report that it is not operating as a High Availability device.

Regardless of whether chassis 105 of FIG. 1 is operating as a High Availability device (in blocks 1227, 1230, and 1233) or not (in block 1206), at block 1236, BMC 125 of FIG. 1 may determine if the configuration of chassis 105 of FIG. 1 is an NVMeoF chassis. If so, then at block 1239, BMC 125 of FIG. 1 may select NVMeoF driver 820 of FIG. 8, at block 1242 driver downloader 805 of FIG. 8 may download the NVMeoF driver 820 of FIG. 8, and at block 1245 driver loader 810 of FIG. 8 may load the NVMeoF driver 820 of FIG. 8. Additionally, at block 1248, BMC 125 of FIG. 1 may collect information about other devices installed in chassis 105 of FIG. 1, thereby acting as a proxy for host 110 of FIG. 1.

If chassis 105 of FIG. 1 is not an NVMeoF chassis, then at block 1251 (FIG. 12D), BMC 125 of FIG. 1 may determine if the configuration of chassis 105 of FIG. 1 is an NVMe chassis. If so, then at block 1254, BMC 125 of FIG. 1 may select NVMeoF driver 820 of FIG. 8, at block 1257 driver downloader 805 of FIG. 8 may download NVMe driver 815 of FIG. 8, and at block 1260 driver loader 810 of FIG. 8 may load NVMe driver 815 of FIG. 8, after which processing ends. If chassis 105 of FIG. 1 is not an NVMe chassis at block 1251, then control may return to block 1215 to report an error.

FIGS. 12A-12D show an example embodiment of the inventive concept. In other embodiments of the inventive concept, there may be more than two chassis configurations. And in yet other embodiments of the inventive concept, BMC 125 of FIG. 1 may use an NVMe driver as a default when no other driver may be loaded. Other variations on FIGS. 12A-12D are also possible.

Figure 13:
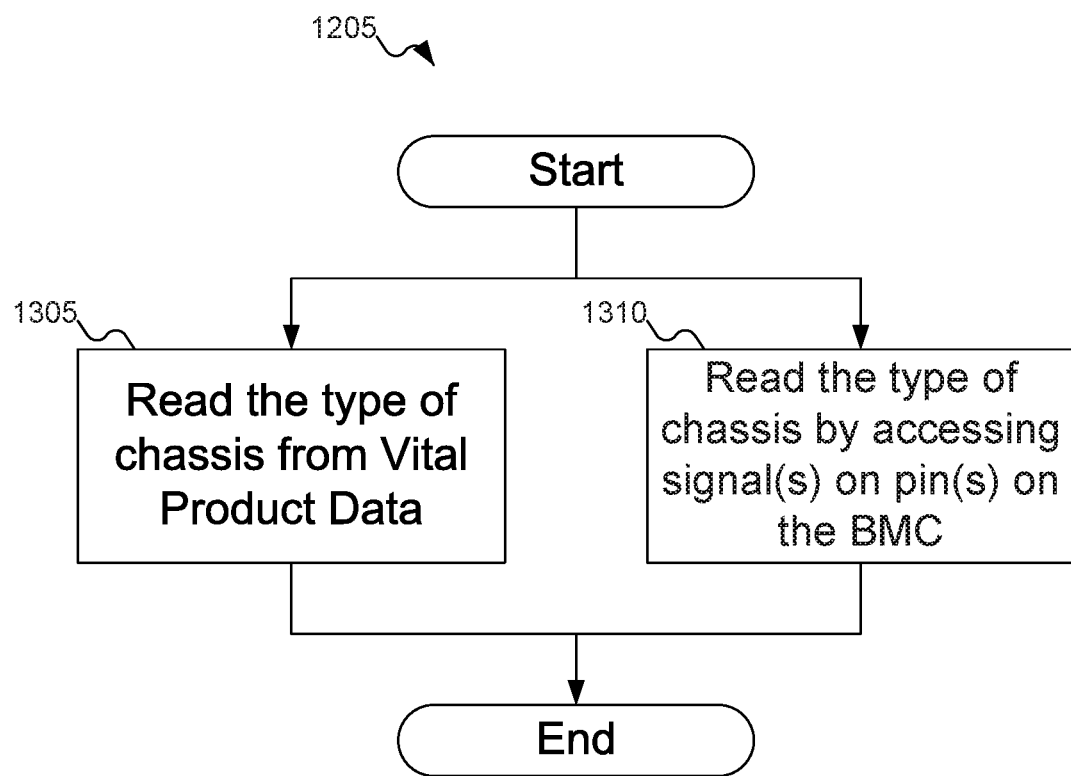
FIG. 13 shows a flowchart of an example procedure for access logic of FIG. 4 to determine the configuration of the chassis of FIG. 1.

FIG. 13 shows a flowchart of an example procedure for access logic 415 of FIG. 4 to determine the configuration of the chassis of FIG. 1. In FIG. 13, at block 1305, VPD reading logic 505 of FIG. 5 may read the configuration of chassis 105 of FIG. 1 from VPD 355 of FIG. 3. Alternatively, at block 1310, pin reading logic 510 may read the configuration of chassis 105 of FIG. 1 from signals sent on one or more pins 605 and 610 of FIG. 6 on BMC 125 of FIG. 1.

Figure 14:
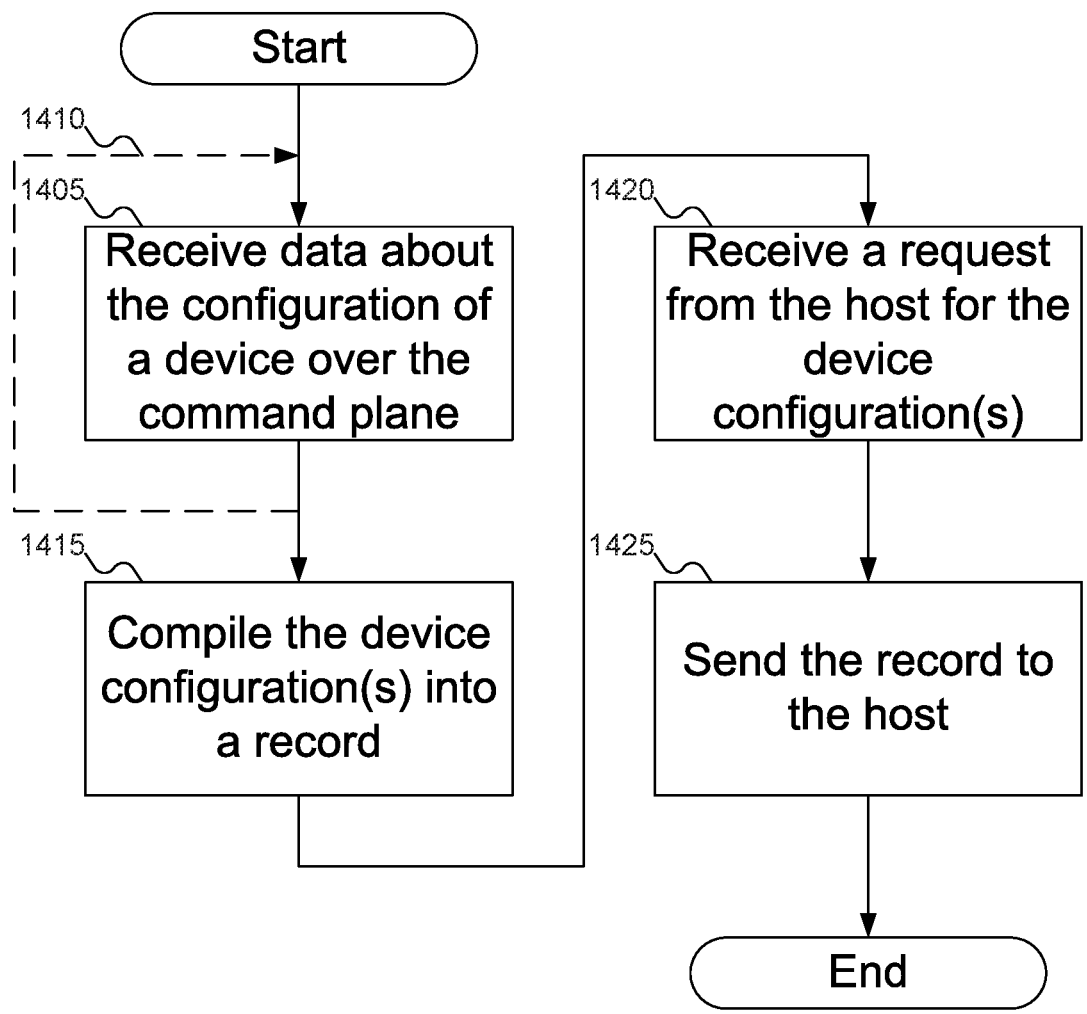
FIG. 14 shows a flowchart of an example procedure for the BMC of FIG. 1 to perform discovery of NVM devices in the chassis of FIG. 1, according to an embodiment of the inventive concept.

FIG. 14 shows a flowchart of an example procedure for BMC 125 of FIG. 1 to perform discovery of NVM devices in chassis 105 of FIG. 1, according to an embodiment of the inventive concept. In FIG. 14, at block 1405, BMC 125 may receive data about the configuration of Network-Attached SSDs 320, 325, and 330 of FIG. 3. Block 1405 may be repeated as often as necessary for all devices, as shown by dashed arrow 1410. At block 1415, BMC 125 of FIG. 1 may compile a record (such as Log Page 1115 of FIG. 11) from the information received from Network-Attached SSDs 320, 325, and 330 of FIG. 3. At block 1420, host 110 of FIG. 1 may send, and BMC 125 of FIG. 1 may receive, a request for the configurations about Network-Attached SSDs 320, 325, and 330 of FIG. 3. At block 1425, BMC 125 of FIG. 1 may send to host 110 of FIG. 1 the record of the device configurations.

Figure 15:
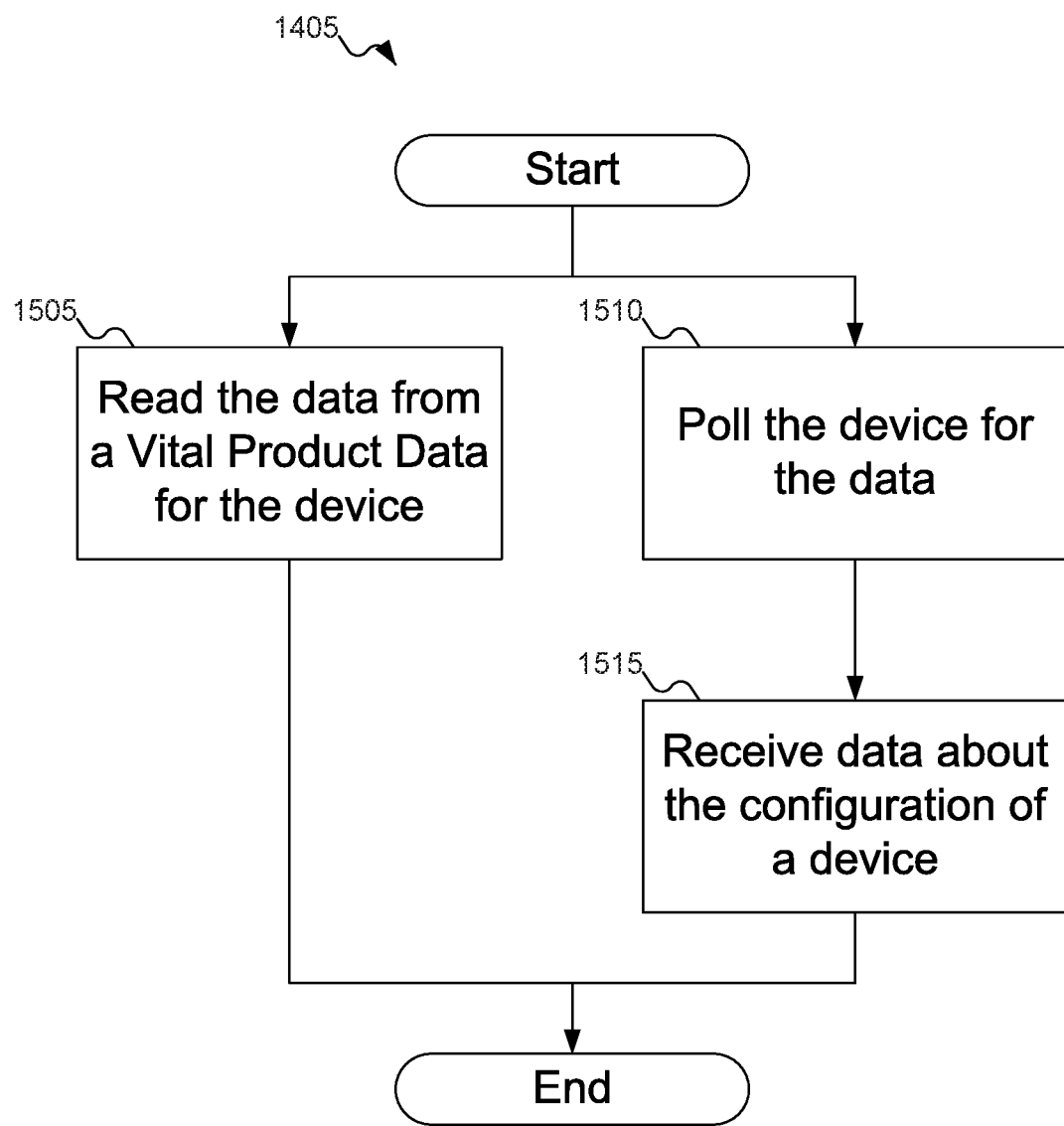
FIG. 15 shows a flowchart of an example procedure for the device communication logic of FIG. 4 to obtain discovery information about the NVM devices of FIG. 3 in the chassis of FIG. 1.

FIG. 15 shows a flowchart of an example procedure for device communication logic 430 of FIG. 4 to obtain discovery information about NVM devices 320, 325, and 330 of FIG. 3 in chassis 105 of FIG. 1. In FIG. 15, at block 1505, read logic 1005 of FIG. 10 may read configuration data about a device from VPD 355 of FIG. 3. Alternatively, at block 1510, polling logic 1010 of FIG. 10 may poll the device for its configuration data, at block 1515 BMC 125 of FIG. 1 may receive the configuration data from the device.

Figure 16:
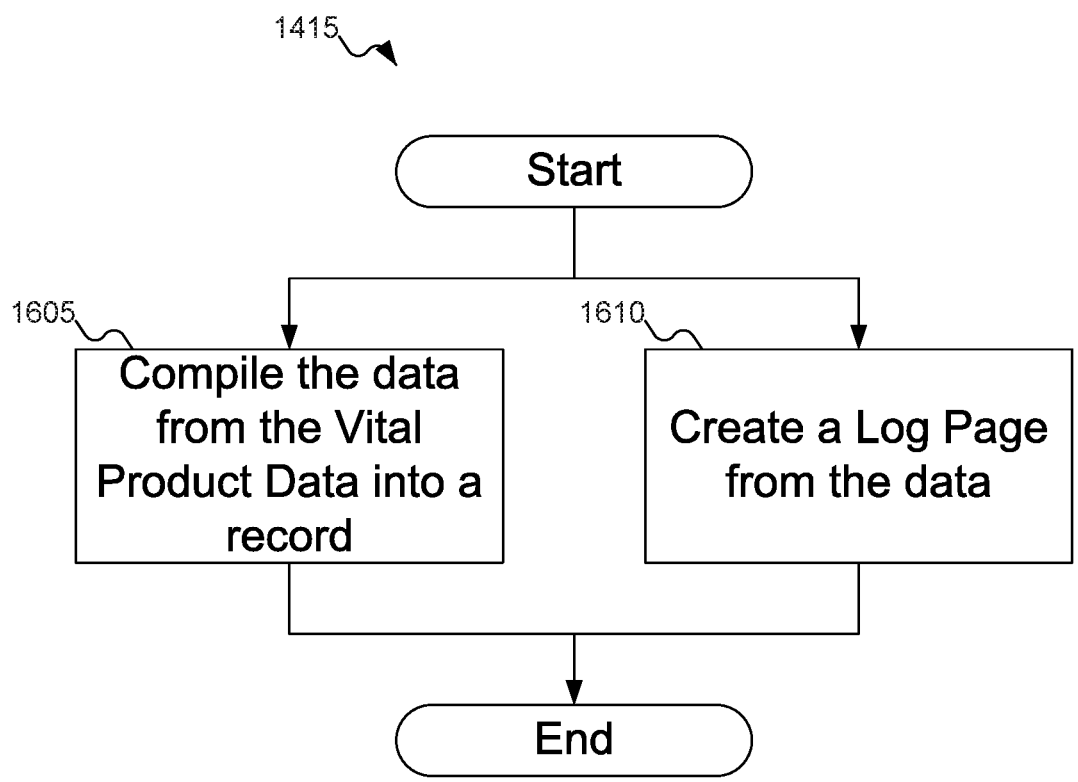
FIG. 16 shows a flowchart of an example procedure for the BMC of FIG. 1 to build a record of the device(s) configurations.

FIG. 16 shows a flowchart of an example procedure for BMC 125 of FIG. 1 to build a record of the device(s) configurations. In FIG. 16, at block 1605, BMC 125 of FIG. 1 may simply compile the collected information from VPD 355 for the various devices into a record. Alternatively, at block 1610, Log Page creation logic 435 of FIG. 4 may create Log Page 1115 of FIG. 11 from the collected device(s) configurations.

Figure 17:
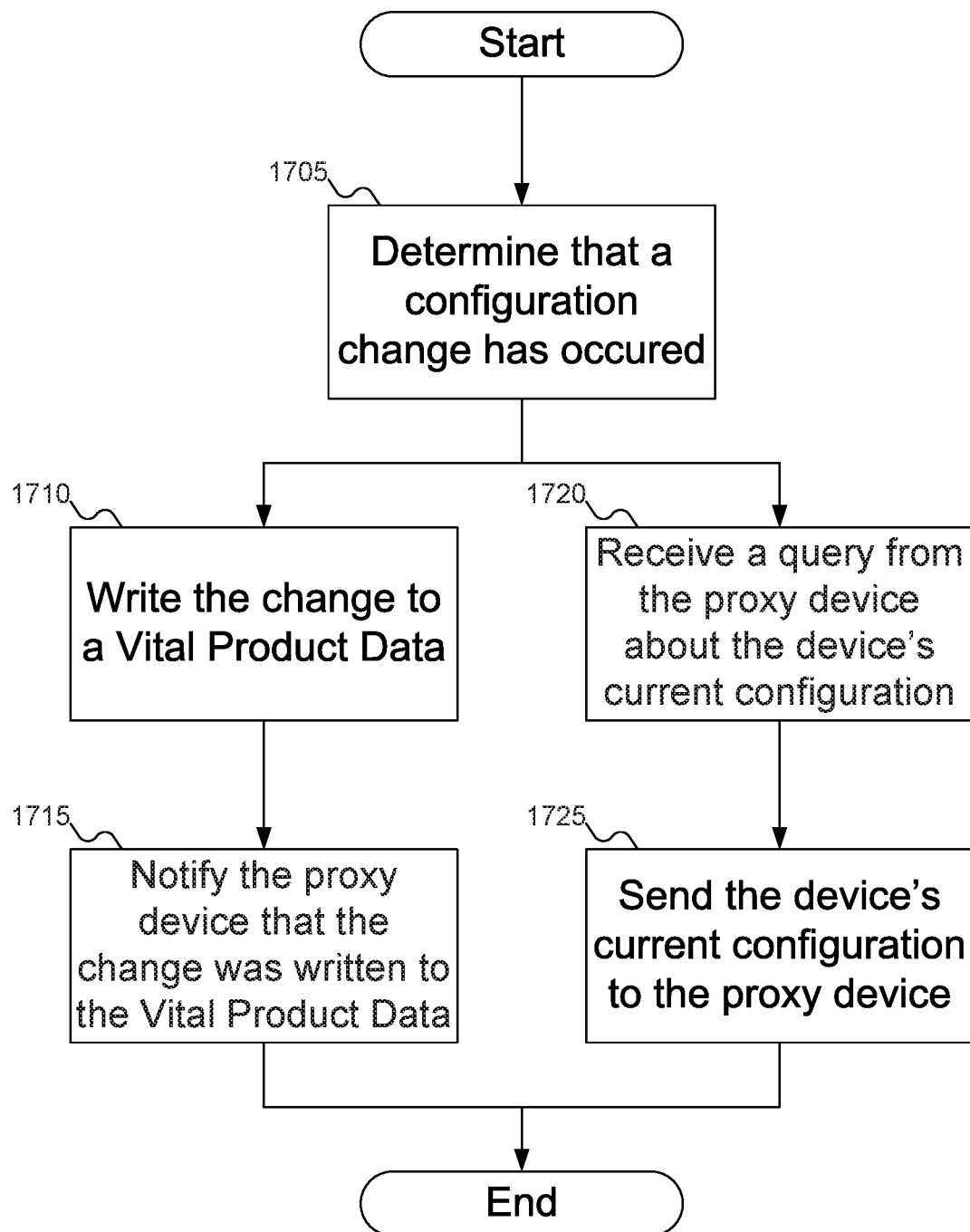
FIG. 17 shows a flowchart of an example procedure for an NVM device in the chassis of FIG. 1 to inform the BMC of FIG. 1 about a change in the configuration of the NVM device, according to an embodiment of the inventive concept.

FIG. 17 shows a flowchart of an example procedure for an NVM device in chassis 105 of FIG. 1 to inform BMC 125 of FIG. 1 about a change in the configuration of the NVM device, according to an embodiment of the inventive concept. In FIG. 17, at block 1705, the device—for example, Network-Attached SSDs 320, 325, and/or 330 of FIG. 3—may determine that its configuration has changed. At block 1710, the device may write the change to VPD 355, and at block 1715 the device may notify a proxy device—such as BMC 125 of FIG. 1—that the change was written to VPD 355. Alternatively, at block 1720, the device may wait until it receives a query from the proxy device about the device's current configuration, at which time (in block 1725) the device may send its current configuration to the proxy device.

In FIGS. 12A-17, some embodiments of the inventive concept are shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

The following discussion is intended to provide a brief, general description of a suitable machine or machines in which certain aspects of the inventive concept may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the inventive concept may include a tangible, non-transitory machine-readable medium comprising instructions executable by one or more processors, the instructions comprising instructions to perform the elements of the inventive concepts as described herein.

Having described and illustrated the principles of the inventive concept with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms may reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept may extend to the following statements, without limitation:

Statement 1. An embodiment of the inventive concept includes a Baseboard Management Controller (BMC) (125), comprising:

an access logic (415) to determine a configuration of a chassis (105); and a built-in self-configuration logic (420) to configure the BMC (125) responsive to the configuration of the chassis (105), wherein the BMC (125) may self-configure without using any BIOS, device drivers, or operating systems.

Statement 2. An embodiment of the inventive concept includes a BMC (125) according to statement 1, wherein the built-in self-configuration logic (420) is operative to configure the BMC (125) to use either a Non-Volatile Memory Express (NVMe) driver (815) or a Non-Volatile Memory Express Over Fabric (NVMeoF) driver (820) responsive to the configuration for the BMC (125).

Statement 3. An embodiment of the inventive concept includes a BMC (125) according to statement 2, wherein using the NVMeoF driver (820) enables the BMC (125) to determine the configuration of at least one device (320, 325, 330) in a chassis (105) including the BMC (125).

Statement 4. An embodiment of the inventive concept includes a BMC (125) according to statement 2, wherein the access logic (415) includes a Vital Product Data (VPD) reading logic (505) to read the configuration of the chassis (105) from a VPD (355).

Statement 5. An embodiment of the inventive concept includes a BMC (125) according to statement 4, wherein the VPD (355) is stored in an Electrically Erasable Programmable Read Only Memory (EEPROM) (345).

Statement 6. An embodiment of the inventive concept includes a BMC (125) according to statement 2, wherein the access logic (415) includes a pin reading logic (510) to determine the configuration of the chassis (105) from a signal on at least one pin (605, 610) on the BMC (125).

Statement 7. An embodiment of the inventive concept includes a BMC (125) according to statement 2, wherein the built-in self-configuration logic (420) includes a driver loader (810) to load the NVMe driver (815) or the NVMeoF driver (820) responsive to the configuration of the chassis (105).

Statement 8. An embodiment of the inventive concept includes a BMC (125) according to statement 7, wherein the built-in self-configuration logic (420) further includes a driver downloader (805) to download the NVMe driver (815) or the NVMeoF driver (820) from a driver source (345, 910, 915).

Statement 9. An embodiment of the inventive concept includes a BMC (125) according to statement 8, wherein the driver source (345, 910, 915) is drawn from a set including storage in an EEPROM (345), a first site (910) on a local computer network (905), and a second site (915) on a global computer network (905).

Statement 10. An embodiment of the inventive concept includes a BMC (125) according to statement 2, wherein the access logic (415) is operative to determine whether the configuration of the chassis (105) includes a High Availability (HA) chassis (105).

Statement 11. An embodiment of the inventive concept includes a BMC (125) according to statement 10, wherein the built-in self-configuration logic (420) is operative to load an HA driver (825).

Statement 12. An embodiment of the inventive concept includes a BMC (125) according to statement 11, wherein the built-in self-configuration logic (420) is operative to load the HA driver (825) before the BMC (125) has determined whether a pairing partner (710) is available.

Statement 13. An embodiment of the inventive concept includes a BMC (125) according to statement 11, further comprising an error reporting logic (425) to report an error if the HA driver (825) is not available.

Statement 14. An embodiment of the inventive concept includes a BMC (125) according to statement 10, further comprising an error reporting logic (425) to report an error if the BMC (125) may not communicate with a pairing partner (710).

Statement 15. An embodiment of the inventive concept includes a method, comprising:

determining (1203) by a Baseboard Management Controller (BMC) (125) a configuration of a chassis (105) including the BMC (125);

selecting (1239, 1254) a driver (815, 820) responsive to the configuration of the chassis (105); and loading (1245) the selected driver (815, 820), wherein the BMC (125) may self-configure without using any BIOS, device drivers, or operating systems.

Statement 16. An embodiment of the inventive concept includes a method according to statement 15, wherein:

the configuration of chassis (105) is drawn from a set including a Non-Volatile Memory Express (NVMe) chassis (105) and a Non-Volatile Memory Express Over Fabric (NVMeoF) chassis (105); and selecting (1239, 1254) a driver (815, 820) responsive to the configuration of the chassis (105) includes selecting (1239, 1254) one of an NVMe driver (815) and an NVMeoF driver (820) for the BMC (125) according to the configuration of the chassis (105).

Statement 17. An embodiment of the inventive concept includes a method according to statement 16, wherein:

determining (1203) by a Baseboard Management Controller (BMC) (125) a configuration of a chassis (105) including the BMC (125) includes determining (1236) by the BMC (125) that the configuration of the chassis (105) is the NVMeoF chassis (105); and the method further comprises determining (1248), by the BMC (125), the configuration of at least one device (320, 325, 330) in the chassis (105) including the BMC (125).

Statement 18. An embodiment of the inventive concept includes a method according to statement 16, wherein determining (1203) by a Baseboard Management Controller (BMC) (125) a configuration of a chassis (105) including the BMC (125) includes reading (1305) the configuration of the chassis (105) from a Vital Product Data (VPD) (355).

Statement 19. An embodiment of the inventive concept includes a method according to statement 18, wherein the VPD (355) is stored in an Electrically Erasable Programmable Read Only Memory (EEPROM) (345).

Statement 20. An embodiment of the inventive concept includes a method according to statement 16, wherein determining (1203) by a Baseboard Management Controller (BMC) (125) a configuration of a chassis (105) including the BMC (125) includes accessing (1310) a signal from at least one pin (605, 610) on the BMC (125) to determine the configuration of the chassis (105).

Statement 21. An embodiment of the inventive concept includes a method according to statement 16, further comprising downloading (1242) the selected driver (815, 820) from a driver source (345, 910, 915).

Statement 22. An embodiment of the inventive concept includes a method according to statement 21, wherein the driver source (345, 910, 915) is drawn from a set including storage in an EEPROM (345), a first site (910) on a local computer network (905), and a second site (915) on a global computer network (905).

Statement 23. An embodiment of the inventive concept includes a method according to statement 16, wherein determining (1203) by a Baseboard Management Controller (BMC) (125) a configuration of a chassis (105) includes determining by the BMC (125) that the configuration of the chassis (105) is a High Availability (HA) chassis (105).

Statement 24. An embodiment of the inventive concept includes a method according to statement 23, wherein selecting a driver for the BMC (125) according to the configuration of the chassis (105) includes selecting (1209) an HA driver (825).

Statement 25. An embodiment of the inventive concept includes a method according to statement 24, further comprising reporting (1215) an error if the HA driver (825) is not available.

Statement 26. An embodiment of the inventive concept includes a method according to statement 24, further comprising attempting (1224) to communicate with a pairing partner (710) for the BMC (125).

Statement 27. An embodiment of the inventive concept includes a method according to statement 26, further comprising reporting (1227) an error if the BMC (125) may not communicate with the pairing partner (710).

Statement 28. An embodiment of the inventive concept includes a method according to statement 26, wherein attempting (1224) to communicate with a pairing partner (710) for the BMC (125) includes attempting (1224) to communicate with the pairing partner (710) for the BMC (125) after loading the HA driver (825).

Statement 29. An embodiment of the inventive concept includes article, comprising a tangible storage medium, the tangible storage medium having stored thereon non-transitory instructions that, when executed by a machine, result in:

determining (1203) by a Baseboard Management Controller (BMC) (125) a configuration of a chassis (105) including the BMC (125);

selecting (1239, 1254) a driver (815, 820) responsive to the configuration of the chassis (105); and loading (1245) the selected driver (815, 820), wherein the BMC (125) may self-configure without using any BIOS, device drivers, or operating systems.

Statement 30. An embodiment of the inventive concept includes an article according to statement 29, wherein:

the configuration of chassis (105) is drawn from a set including a Non-Volatile Memory Express (NVMe) chassis (105) and a Non-Volatile Memory Express Over Fabric (NVMeoF) chassis (105);

selecting (1239, 1254) a driver (815, 820) responsive to the configuration of the chassis (105) includes selecting (1239, 1254) one of an NVMe driver (815) and an NVMeoF driver (820) for the BMC (125) according to the configuration of the chassis (105).

Statement 31. An embodiment of the inventive concept includes an article according to statement 30, wherein:

determining (1203) by a Baseboard Management Controller (BMC) (125) a configuration of a chassis (105) including the BMC (125) includes determining (1236) by the BMC (125) that the configuration of the chassis (105) is the NVMeoF chassis (105); and the tangible storage medium having stored thereon further non-transitory instructions that, when executed by the machine, result in determining (1248), by the BMC (125), the configuration of at least one device (320, 325, 330) in the chassis (105) including the BMC (125).

Statement 32. An embodiment of the inventive concept includes an article according to statement 30, wherein determining (1203) by a Baseboard Management Controller (BMC) (125) a configuration of a chassis (105) including the BMC (125) includes reading (1305) the configuration of the chassis (105) from a Vital Product Data (VPD) (355).

Statement 33. An embodiment of the inventive concept includes an article according to statement 32, wherein the VPD (355) is stored in an Electrically Erasable Programmable Read Only Memory (EEPROM) (345).

Statement 34. An embodiment of the inventive concept includes an article according to statement 30, wherein determining (1203) by a Baseboard Management Controller (BMC) (125) a configuration of a chassis (105) including the BMC (125) includes accessing (1310) a signal from at least one pin (605, 610) on the BMC (125) to determine the configuration of the chassis (105).

Statement 35. An embodiment of the inventive concept includes an article according to statement 30, the tangible storage medium having stored thereon further non-transitory instructions that, when executed by the machine, result in downloading (1242) the selected driver (815, 820) from a driver source (345, 910, 915).

Statement 36. An embodiment of the inventive concept includes an article according to statement 35, wherein the driver source (345, 910, 915) is drawn from a set including storage in an EEPROM (345), a first site (910) on a local computer network (905), and a second site (915) on a global computer network (905).

Statement 37. An embodiment of the inventive concept includes an article according to statement 30, wherein determining (1203) by a Baseboard Management Controller (BMC) (125) a configuration of a chassis (105) includes determining by the BMC (125) that the chassis (105) is a High Availability (HA) chassis (105).

Statement 38. An embodiment of the inventive concept includes an article according to statement 37, wherein selecting a driver for the BMC (125) according to the configuration of the chassis (105) includes selecting (1209) an HA driver (825).

Statement 39. An embodiment of the inventive concept includes an article according to statement 38, the tangible storage medium having stored thereon further non-transitory instructions that, when executed by the machine, result in reporting (1215) an error if the HA driver (825) is not available.

Statement 40. An embodiment of the inventive concept includes an article according to statement 38, the tangible storage medium having stored thereon further non-transitory instructions that, when executed by the machine, result in attempting (1224) to communicate with a pairing partner (710) for the BMC (125).

Statement 41. An embodiment of the inventive concept includes an article according to statement 40, the tangible storage medium having stored thereon further non-transitory instructions that, when executed by the machine, result in reporting (1227) an error if the BMC (125) may not communicate with the pairing partner (710).

Statement 42. An embodiment of the inventive concept includes an article according to statement 40, wherein attempting (1224) to communicate with a pairing partner (710) for the BMC (125) includes attempting (1224) to communicate with the pairing partner (710) for the BMC (125) after loading the HA driver (825).

Statement 43. An embodiment of the inventive concept includes a proxy device (125) in a chassis (105), comprising:

a device communication logic (430) to communicate with at least one device (320, 325, 330) over a control plane about data regarding the at least one device (320, 325, 330);

a reception logic (440) to receive a query (1105) from a host (110), the query (1105) requesting information about the at least one device (320, 325, 330); and a transmission logic (445) to send a response (1110) to the host (110), the response (1110) including data about the at least one device (320, 325, 330).

Statement 44. An embodiment of the inventive concept includes a proxy device (125) according to statement 43, wherein the proxy device (125) is drawn from a set including a Baseboard Management Controller (BMC) (125), a Redundant Array of Independent Disks (RAID) controller, and a processor (305).

Statement 45. An embodiment of the inventive concept includes a proxy device (125) according to statement 43, wherein the at least one device (320, 325, 330) is drawn from a set including a storage device (320, 325, 330) and a Network Interface Card (NIC).

Statement 46. An embodiment of the inventive concept includes a proxy device (125) according to statement 43, wherein the device communication logic (430) includes a read logic (1005) to read the data regarding the at least one device (320, 325, 330) from a Vital Product Data (360) for the at least one device (320, 325, 330).

Statement 47. An embodiment of the inventive concept includes a proxy device (125) according to statement 46, wherein the Vital Product Data (360) is stored in an Electrically Erasable Programmable Read Only Memory (EEPROM) (345).

Statement 48. An embodiment of the inventive concept includes a proxy device (125) according to statement 43, wherein:

the device communication logic (430) includes a polling logic (1010) to poll the at least one device (320, 325, 330) for the data regarding the at least one device (320, 325, 330); and the reception logic (440) is operative to receive the data regarding the at least one device (320, 325, 330) from the at least one device (320, 325, 330).

Statement 49. An embodiment of the inventive concept includes a proxy device (125) according to statement 43, wherein the chassis (105) includes permanent storage associated with the proxy device (125) in which the proxy device (125) may create a Log Page (1115) from the data regarding the at least one device (320, 325, 330).

Statement 50. An embodiment of the inventive concept includes a proxy device (125) according to statement 49, further comprising a Log Page creation logic (435) to create a Log Page (1115) from the data about the at least one device (320, 325, 330).

Statement 51. An embodiment of the inventive concept includes a proxy device (125) according to statement 49, wherein the transmission logic (445) is operative to send the Log Page (1115) to the host (110) responsive to the query (1105).

Statement 52. An embodiment of the inventive concept includes a method, comprising:

receiving (1405, 1410), at a proxy device (125), at least one data from at least one device (320, 325, 330) about configurations of the at least one device (320, 325, 330), the data from the at least one device (320, 325, 330) received over a control plane;

compiling (1415) the at least one data into a record (1115);

receiving (1420), at the proxy device (125), a query (1105) from a host (110) for the configurations of the at least one device (320, 325, 330); and sending (1425) the record (1115) from the proxy device (125) to the host (110), wherein the proxy device (125) may receive (1405, 1410) the at least one data from the at least one device (320, 325, 330) and compile (1415) the at least one data into a record (1115) before receiving (1420) the query (1105) from the host (110).

Statement 53. An embodiment of the inventive concept includes a method according to statement 52, wherein the proxy device (125) is drawn from a set including a Baseboard Management Controller (BMC) (125), a Redundant Array of Independent Disks (RAID) controller, a processor (305), or a software proxy device.

Statement 54. An embodiment of the inventive concept includes a method according to statement 52, wherein the at least one device (320, 325, 330) is drawn from a set including a storage device (320, 325, 330) and a Network Interface Card (NIC).

Statement 55. An embodiment of the inventive concept includes a method according to statement 52, wherein receiving (1405, 1410), at a proxy device (125), at least one data from at least one device (320, 325, 330) about configurations of the at least one device (320, 325, 330) includes receiving (1405, 1410), at the proxy device (125), the at least one data from the at least one device (320, 325, 330) about configurations of the at least one device (320, 325, 330) along a control plane.

Statement 56. An embodiment of the inventive concept includes a method according to statement 52, wherein receiving (1405, 1410), at a proxy device (125), at least one data from at least one device (320, 325, 330) about configurations of the at least one device (320, 325, 330) includes polling (1510) the at least one device (320, 325, 330) for the configurations of the at least one device (320, 325, 330).

Statement 57. An embodiment of the inventive concept includes a method according to statement 52, wherein receiving (1405, 1410), at a proxy device (125), at least one data from at least one device (320, 325, 330) about configurations of the at least one device (320, 325, 330) includes receiving (1405, 1410) a datum from one of the at least one device (320, 325, 330) when a configuration of the one of the at least one device (320, 325, 330) changes.

Statement 58. An embodiment of the inventive concept includes a method according to statement 52, wherein receiving (1405, 1410), at a proxy device (125), at least one data from at least one device (320, 325, 330) about configurations of the at least one device (320, 325, 330) includes reading (1505) the at least one data from at least one Vital Product Data (360).

Statement 59. An embodiment of the inventive concept includes a method according to statement 58, wherein the at least one Vital Product Data (360) are stored in an Electrically Erasable Programmable Read Only Memory (EEPROM) (345).

Statement 60. An embodiment of the inventive concept includes a method according to statement 52, wherein compiling (1415) the at least one data into a record (1115) includes creating (1610) a Log Page (1115) from the at least one data.

Statement 61. An embodiment of the inventive concept includes a method according to statement 60, wherein sending (1425) the configurations of the at least one device (320, 325, 330) from the proxy device (125) to the host (110) includes sending (1425) the Log Page (1115) from the proxy device (125) to the host (110).

Statement 62. An embodiment of the inventive concept includes a method according to statement 52, wherein sending (1425) the configurations of the at least one device (320, 325, 330) from the proxy device (125) to the host (110) includes sending (1425) the at least one data from the proxy device (125) to the host (110).

Statement 63. An embodiment of the inventive concept includes a method, comprising:

determining (1705), by a device (320, 325, 330), a change in a configuration of the device (320, 325, 330); and notifying (1710, 1715, 1720, 1725) a proxy device (125) over a control plane about the change in the configuration of the device (320, 325, 330).

Statement 64. An embodiment of the inventive concept includes a method according to statement 63, wherein the proxy device (125) is drawn from a set including a Baseboard Management Controller (BMC) (125), a Redundant Array of Independent Disks (RAID) controller, a processor (305), or a software proxy device.

Statement 65. An embodiment of the inventive concept includes a method according to statement 63, wherein the at least one device (320, 325, 330) is drawn from a set including a storage device (320, 325, 330) and a Network Interface Card (NIC).

Statement 66. An embodiment of the inventive concept includes a method according to statement 63, wherein notifying (1710, 1715, 1720, 1725) a proxy device (125) about the change in the configuration of the device (320, 325, 330) includes writing (1710) the change in the configuration of the device (320, 325, 330) to a Vital Product Data (360) that may be read by the proxy device (125).

Statement 67. An embodiment of the inventive concept includes a method according to statement 66, wherein notifying (1710, 1715, 1720, 1725) a proxy device (125) about the change in the configuration of the device (320, 325, 330) further includes notifying (1715) the proxy device (125) that the change in the configuration of the device (320, 325, 330) was written to the Vital Product Data (360).

Statement 68. An embodiment of the inventive concept includes a method according to statement 63, wherein notifying (1710, 1715, 1720, 1725) a proxy device (125) about the change in the configuration of the device (320, 325, 330) includes:

receiving (1720) a query (1105) from the proxy device (125) about a current status of the configuration of the device (320, 325, 330); and sending (1725) a response (1110) to the proxy device (125) including the change in the configuration of the device (320, 325, 330).

Statement 69. An embodiment of the inventive concept includes an embodiment of the inventive concept includes an article, comprising a tangible storage medium, the tangible storage medium having stored thereon non-transitory instructions that, when executed by a machine, result in:

receiving (1405, 1410), at a proxy device (125), at least one data from at least one device (320, 325, 330) about configurations of the at least one device (320, 325, 330), the data from the at least one device (320, 325, 330) received over a control plane;

compiling (1415) the at least one data into a record (1115);

receiving (1420), at the proxy device (125), a query (1105) from a host (110) for the configurations of the at least one device (320, 325, 330); and sending (1425) the record (1115) from the proxy device (125) to the host (110), wherein the proxy device (125) may receive (1405, 1410) the at least one data from the at least one device (320, 325, 330) and compile (1415) the at least one data into a record (1115) before receiving (1420) the query (1105) from the host (110).

Statement 70. An embodiment of the inventive concept includes an article according to statement 69, wherein the proxy device (125) is drawn from a set including a Baseboard Management Controller (BMC) (125), a Redundant Array of Independent Disks (RAID) controller, a processor (305), or a software proxy device.

Statement 71. An embodiment of the inventive concept includes an article according to statement 69, wherein the at least one device (320, 325, 330) is drawn from a set including a storage device (320, 325, 330) and a Network Interface Card (NIC).

Statement 72. An embodiment of the inventive concept includes an article according to statement 69, wherein receiving (1405, 1410), at a proxy device (125), at least one data from at least one device (320, 325, 330) about configurations of the at least one device (320, 325, 330) includes receiving (1405, 1410), at the proxy device (125), the at least one data from the at least one device (320, 325, 330) about configurations of the at least one device (320, 325, 330) along a control plane.

Statement 73. An embodiment of the inventive concept includes an article according to statement 69, wherein receiving (1405, 1410), at a proxy device (125), at least one data from at least one device (320, 325, 330) about configurations of the at least one device (320, 325, 330) includes polling (1510) the at least one device (320, 325, 330) for the configurations of the at least one device (320, 325, 330).

Statement 74. An embodiment of the inventive concept includes an article according to statement 69, wherein receiving (1405, 1410), at a proxy device (125), at least one data from at least one device (320, 325, 330) about configurations of the at least one device (320, 325, 330) includes receiving (1405, 1410) a datum from one of the at least one device (320, 325, 330) when a configuration of the one of the at least one device (320, 325, 330) changes.

Statement 75. An embodiment of the inventive concept includes an article according to statement 69, wherein receiving (1405, 1410), at a proxy device (125), at least one data from at least one device (320, 325, 330) about configurations of the at least one device (320, 325, 330) includes reading (1505) the at least one data from at least one Vital Product Data (360).

Statement 76. An embodiment of the inventive concept includes an article according to statement 75, wherein the at least one Vital Product Data (360) are stored in an Electrically Erasable Programmable Read Only Memory (EEPROM) (345).

Statement 77. An embodiment of the inventive concept includes an article according to statement 69, wherein compiling (1415) the at least one data into a record (1115) includes creating (1610) a Log Page (1115) from the at least one data.

Statement 78. An embodiment of the inventive concept includes an article according to statement 77, wherein sending (1425) the configurations of the at least one device (320, 325, 330) from the proxy device (125) to the host (110) includes sending (1425) the Log Page (1115) from the proxy device (125) to the host (110).

Statement 79. An embodiment of the inventive concept includes an article according to statement 69, wherein sending (1425) the configurations of the at least one device (320, 325, 330) from the proxy device (125) to the host (110) includes sending (1425) the at least one data from the proxy device (125) to the host (110).

Statement 80. An embodiment of the inventive concept includes an embodiment of the inventive concept includes an article, comprising a tangible storage medium, the tangible storage medium having stored thereon non-transitory instructions that, when executed by a machine, result in:

determining (1705), by a device (320, 325, 330), a change in a configuration of the device (320, 325, 330); and notifying (1710, 1715, 1720, 1725) a proxy device (125) over a control plane about the change in the configuration of the device (320, 325, 330).

Statement 81. An embodiment of the inventive concept includes an article according to statement 80, wherein the proxy device (125) is drawn from a set including a Baseboard Management Controller (BMC) (125), a Redundant Array of Independent Disks (RAID) controller, a processor (305), or a software proxy device.

Statement 82. An embodiment of the inventive concept includes an article according to statement 80, wherein the at least one device (320, 325, 330) is drawn from a set including a storage device (320, 325, 330) and a Network Interface Card (NIC).

Statement 83. An embodiment of the inventive concept includes an article according to statement 80, wherein notifying (1710, 1715, 1720, 1725) a proxy device (125) about the change in the configuration of the device (320, 325, 330) includes writing (1710) the change in the configuration of the device (320, 325, 330) to a Vital Product Data (360) that may be read by the proxy device (125).

Statement 84. An embodiment of the inventive concept includes an article according to statement 83, wherein notifying (1710, 1715, 1720, 1725) a proxy device (125) about the change in the configuration of the device (320, 325, 330) further includes notifying (1715) the proxy device (125) that the change in the configuration of the device (320, 325, 330) was written to the Vital Product Data (360).

Statement 85. An embodiment of the inventive concept includes an article according to statement 80, wherein notifying (1710, 1715, 1720, 1725) a proxy device (125) about the change in the configuration of the device (320, 325, 330) includes:

receiving (1720) a query (1105) from the proxy device (125) about a current status of the configuration of the device (320, 325, 330); and sending (1725) a response (1110) to the proxy device (125) including the change in the configuration of the device (320, 325, 330).

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A Baseboard Management Controller (BMC), comprising:
   a Vital Product Data (VPD) reading logic to read an actual configuration of a chassis from a VPD stored in a memory inside the chassis during boot up, the chassis separate from the BMC; and
   a built-in self-configuration logic to configure the BMC responsive to the actual configuration of the chassis,
   wherein the BMC is configured to select a configuration from a first configuration and a second configuration, the first configuration including a Non-Volatile Memory Express (NVMe) driver, the second configuration including a Non-Volatile Memory Express Over Fabric (NVMeoF) driver, the BMC is configured to load a High Availability (HA) driver before the BMC has determined whether a pairing partner is available, and the BMC is configured to determine that the configuration of the chassis includes an HA chassis based at least in part on the actual configuration read from the VPD.

2. A BMC according to claim 1, wherein using the NVMeoF driver enables the BMC to determine the actual configuration of at least one device in the chassis including the BMC.

3. A BMC according to claim 1, wherein the memory includes an Electrically Erasable Programmable Read Only Memory (EEPROM).

4. A BMC according to claim 1, wherein the built-in self-configuration logic includes a driver loader to load the NVMe driver or the NVMeoF driver responsive to the actual configuration of the chassis.

5. A BMC according to claim 1, wherein the built-in self-configuration logic is configured to load an HA driver.

6. A method, comprising:
   reading, by a Baseboard Management Controller (BMC), an actual configuration of a chassis including the BMC from a Vital Product Data (VPD) stored in a memory inside the chassis during boot up, the chassis separate from the BMC;
   selecting one of a Non-Volatile Memory Express (NVMe) driver and a Non-Volatile Memory Express Over Fabric (NVMeoF) driver for the BMC responsive to the actual configuration of the chassis;
   loading the selected driver; and
   attempting to communicate with a pairing partner for the BMC after loading a High Availability (HA) driver,
   wherein the BMC is configured to select a configuration from a first configuration and a second configuration, the first configuration including the NVMe driver, the second configuration including the NVMeoF driver, the BMC is configured to load the HA driver before the BMC has determined whether a pairing partner is available, and the BMC is configured to determine that the configuration of the chassis includes an HA chassis based at least in part on the actual configuration read from the VPD.

7. A method according to claim 6, wherein the memory includes an Electrically Erasable Programmable Read Only Memory (EEPROM).

8. A method according to claim 6, wherein selecting a driver for the BMC according to the actual configuration of the chassis includes selecting the HA driver.

9. A method according to claim 8, further comprising reporting an error if the HA driver is not available.

10. A method according to claim 8, further comprising attempting to communicate with the pairing partner for the BMC.

11. A method according to claim 10, further comprising reporting an error if the BMC is not operative to communicate with the pairing partner.

12. A method according to claim 10, wherein attempting to communicate with the pairing partner for the BMC includes attempting to communicate with the pairing partner for the BMC after loading the HA driver.

13. An article, comprising a tangible, non-transitory storage medium, the tangible, non-transitory storage medium having stored thereon instructions that, when executed by a machine, result in:
   reading, by a Baseboard Management Controller (BMC), an actual configuration of a chassis including the BMC from a Vital Product Data (VPD) stored in a memory inside the chassis during boot up, the chassis separate from the BMC;
   selecting one of a Non-Volatile Memory Express (NVMe) driver and a Non-Volatile Memory Express Over Fabric (NVMeoF) driver for the BMC responsive to the actual configuration of the chassis;
   loading the selected driver; and
   attempting to communicate with a pairing partner for the BMC after loading a High Availability (HA) driver,
   wherein the BMC is configured to select a configuration from a first configuration and a second configuration, the first configuration including the NVMe driver, the second configuration including the NVMeoF driver, the BMC is configured to load the HA driver before the BMC has determined whether a pairing partner is available, and the BMC is configured to determine that the configuration of the chassis includes an HA chassis based at least in part on the actual configuration read from the VPD.

14. An article according to claim 13, wherein:
   reading, by a Baseboard Management Controller (BMC), an actual configuration of chassis including the BMC includes reading, by the BMC, that the actual configuration of the chassis is the NVMeoF chassis; and
   the tangible, non-transitory storage medium having stored thereon further instructions that, when executed by the machine, result in reading, by the BMC, the actual configuration of at least one device in the chassis including the BMC.

* * * * *